(12) United States Patent
Kondo et al.

(10) Patent No.: US 6,864,693 B2
(45) Date of Patent: Mar. 8, 2005

(54) SEMICONDUCTOR INTEGRATED CIRCUIT WITH NEGATIVE VOLTAGE GENERATION CIRCUIT, TEST METHOD FOR THE SAME, AND RECORDING DEVICE AND COMMUNICATION EQUIPMENT HAVING THE SAME

(75) Inventors: Masataka Kondo, Osaka (JP); Kiyoto Ohta, Osaka (JP); Tomonori Fujimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 168 days.

(21) Appl. No.: 09/852,839

(22) Filed: May 10, 2001

(65) Prior Publication Data

US 2001/0045841 A1 Nov. 29, 2001

(30) Foreign Application Priority Data

May 22, 2000 (JP) ........................................ 2000-150302

(51) Int. Cl.$^7$ ............................ G01R 27/08; H01L 21/31
(52) U.S. Cl. ............................ 324/713; 324/719; 360/46
(58) Field of Search ............................ 365/185.18, 226; 327/81; 324/765, 158.1, 771, 769, 647, 522, 525, 537, 691, 719, 713, 714; 360/46

(56) References Cited

U.S. PATENT DOCUMENTS

| | | | |
|---|---|---|---|
| 5,341,035 A | | 8/1994 | Shibayama et al. ......... 327/537 |
| 5,553,295 A | * | 9/1996 | Pantelakis et al. .......... 713/300 |
| 5,659,502 A | | 8/1997 | Sali et al. ............... 365/185.18 |
| 5,670,907 A | | 9/1997 | Gorecki et al. ............. 327/535 |
| 5,673,232 A | * | 9/1997 | Furutani ..................... 365/226 |
| 6,031,397 A | * | 2/2000 | Banba .......................... 327/81 |
| 6,195,305 B1 | | 2/2001 | Fujisawa et al. ............. 327/535 |
| 6,229,379 B1 | | 5/2001 | Okamoto .................... 365/226 |

FOREIGN PATENT DOCUMENTS

| | | |
|---|---|---|
| JP | 1-290191 | 11/1989 |
| JP | 4-38791 | 2/1992 |
| JP | 7-219658 | 8/1995 |
| JP | 9-51266 | 2/1997 |
| JP | 11-150230 | 6/1999 |
| JP | 11-297950 | 10/1999 |

* cited by examiner

Primary Examiner—Vincent Q. Nguyen
(74) Attorney, Agent, or Firm—Merchant & Gould P.C.

(57) ABSTRACT

A semiconductor integrated circuit is provided in which a negative voltage generation circuit capable of supplying a memory cell transistor substrate with a stable negative voltage, independently of the fluctuation of a power source voltage or environmental conditions and the process conditions etc., is realized easily, and in which the data holding time of a memory can be secured sufficiently, and the power consumption is reduced. A voltage detection part 1-B included in the negative voltage generation circuit is provided with a constant voltage generation circuit 1-B1, a measuring voltage generation circuit 1-B3, which receives a constant voltage STDVOUT sent from the constant voltage generation circuit via a voltage supplying circuit 1-B2 and a negative voltage VBB sent from a negative voltage generation part and converts it into a measuring voltage REFV0 by resistors R1', R2', a first comparator AMP12, which compares the measuring voltage sent from the measuring voltage generation circuit with ground voltage and outputs the result of comparison, and an output buffer circuit 1-B4', which amplifies the compared output from the first comparator and outputs it to the negative voltage generation part.

18 Claims, 18 Drawing Sheets

SEMICONDUCTOR INTEGRATED CIRCUIT WITH NEGATIVE VOLTAGE GENERATION CIRCUIT, TEST METHOD FOR THE SAME, AND RECORDING DEVICE AND COMMUNICATION EQUIPMENT HAVING THE SAME

BACKGROUND OF THE INVENTION

1. Field of the Invention

The present invention relates to a semiconductor integrated circuit, more specifically to a power source voltage generation circuit incorporated into a semiconductor integrated circuit, a test method for this semiconductor integrated circuit, an optical and/or magnetic recording device and communication equipment having this semiconductor integrated circuit.

2. Description of the Related Art

Here, as a functional circuit using a power source voltage generation circuit incorporated into a semiconductor integrated circuit, a dynamic type memory device will be referred to in the explanation.

In a dynamic type memory device, as a method for accessing data of storage elements (memory cells) arranged in a matrix form, the operation of read and write is carried out by supplying word lines with an electric potential and exchanging the data between bit lines and the memory cells.

FIG. 11 shows a circuit configuration of a memory cell part in a general dynamic random access memory (DRAM).

In the storage operation of a DRAM, a potential of a logic "H" level or a potential of a logic "L" level sent from a bit line BL shown in FIG. 11 is used to accumulate electric charges in a memory cell capacitor CO via an access transistor TMEM so as to write data of a logic "H" level or data of a logic "L" level in the memory cell capacitor CO and to store data.

In recent years, along with the development of a DRAM to have higher integration and larger capacity, the circuit as a whole is designed to be miniaturized, and also the area of a memory cell capacitor CO tends to become more minute, so that the capacity also tends to be reduced. Here, to ensure the operation of a memory even in the case where the capacity of a memory cell capacitor CO is reduced, it is necessary to secure a charge storage time sufficiently for the memory cell capacitor CO.

For this purpose, the loss of charge from the memory cell capacitor CO, due to leakage currents via the access transistor TMEM that transmits charges, needs to be prevented.

Therefore, a measure generally taken for the DRAM to prevent the loss of charge is to apply a negative voltage to the substrate of the access transistor TMEM, thus to increase a threshold voltage VT of the access transistor TMEM, and to suppress the leakage currents via the access transistor TMEM.

FIG. 12 shows a cross-sectional structure of a memory cell transistor TMEM.

In FIG. 12, leakage components of charges from a memory cell capacitor C connected to a source (S) of an access transistor TMEM can be divided into a leakage current component I (off), directed from the source of TMEM to a drain (D), and a leakage current component I (leak), directed from a n-type impurity diffusion area of the source to a p-type substrate (p-Sub.).

Here, in FIG. 12, the current direction from the p-type area to the n-type area will be defined as a normal direction.

The graph of FIG. 13A shows the dependency of I (of) on a substrate voltage VBB, and the graph of FIG. 13B shows the dependency of I (leak) on a substrate voltage VBB.

When potential is not applied to word lines WL and the word lines are in an inactive state, it is shown in FIG. 13A that the current between the drain and a source Ids in an area indicated by (i) becomes I (off). Here, due to the application of the substrate potential VBB, the threshold voltage VT of the access transistor TMEM increases, and the inclination of the graph becomes gentle, so that the phenomenon of I (off) accompanied by the application of the substrate potential VBB is observed.

On the other hand, looking at a current Ip-n at a p-n junction shown in FIG. 13B, accompanied by the application of a negative substrate potential VBB, Ip-n increases in the third quadrant of the graph shown in FIG. 13B. This shows that, accompanied by the increase of VBB, the current from the n-type impurity diffusion area of the source to the p-type substrate is increased, that is, the leakage currents Ip-n=I (leak) from the source area to the p-type substrate of the TMEM are increased.

Next, FIG. 14 shows a general configuration of a negative voltage generation circuit, which conventionally is used for generating a negative voltage VBB to be applied to a p-type substrate.

In FIG. 14, the negative voltage generation circuit includes a substrate voltage generation part (charge pump part) 15-A and a voltage detection part 15-B. The substrate voltage generation part 15-A includes a self-oscillating circuit 15-A1, a timing generation logic circuit 15-A2 and a charge pump circuit 15-A3, and the self-oscillating circuit 15-A1 operates for a period during which a control signal BBGOE generated by the voltage detection part 15-B is in a logic "H" level.

The charge pump circuit 15-A3 is driven by a timing signal generated by the timing generation circuit 15-A2, and thus, a negative voltage VBB is generated.

This negative voltage generation circuit has the function of controlling the substrate voltage generation part 15-A by the voltage detection part 15-B and maintaining the negative voltage VBB to be applied to the substrate at a predetermined value.

FIG. 15 shows a configuration example of the voltage detection part 15-B.

In the voltage detection part 15-B shown in FIG. 15, by means of a voltage divider circuit including a P-channel transistor TP151, a N-channel transistor TN152 and resistor R153, a potential DETIN with the voltage divided from a power source voltage VDD and a substrate voltage VBB is generated, and the relative size thereof with a set voltage is judged by an inverter including P-channel transistors TP154, TP155 and a N-channel transistor TN156, which is then amplified by inverters I157, I158 and I159, and the relative size is output as a logic signal BBGOE.

FIG. 16A shows the characteristics of the negative voltage VBB relative to the power source voltage VDD in the negative voltage generation circuit shown in FIG. 14. FIG. 16B shows the characteristics of a pause time, which is a data holding time of a memory.

As shown in FIG. 16A, in the voltage detection part 15-B, as the power source voltage VDD increases, the negative voltage VBB applied to the substrate increases, whereas VBB decreases as VDD decreases. Furthermore, as shown in FIG. 16B, there is a power source voltage VDDP having the longest pause time, and when the power source voltage VDD is either larger or smaller than VDDP, the data holding time becomes shorter. This is because, when the negative voltage VBB is applied to the substrate of the memory cell transistor, as shown in FIG. 13A, the threshold voltage of the memory cell transistor increases (VT1→VT2→VT3), and the current component I (off directed from the source to the drain decreases, while the leakage current component I (leak) directed to the p-type substrate increases, due to the level change of VBB accompanied by the increase of VDD. The characteristics of the pause time shown in FIG. 16B are used to show the characteristics of a DRAM memory cell as a disturb pause (P1) caused by the decreasing current component I (off) and a static pause (P2) caused by the increasing current component I (leak).

Therefore, when the negative voltage VBB applied to the substrate is set, by taking the two kinds of leakage paths of charges mentioned above into consideration, the circuit preferably is designed in the voltage conditions for the minimum leakage charges in respective paths and also to be independent of the power source voltage. The application of such a negative voltage generation circuit can reduce the leakage currents and set a long data holding time for the memory, so that the power consumption of the memory can be reduced. In particular, this circuit is useful in the case where low power consumption is desired, such as for portable communication equipment and so forth.

Furthermore, when the power consumption of a circuit is reduced, heat generation can be suppressed, so that it is now possible to achieve a stable operation also for other electronic circuits.

However, the configuration of the conventional voltage detection part 15-B described above has characteristics that the potential DETIN with the voltage divided from the power source voltage VDD and the substrate potential VBB is used for judging the relative size with the set voltage, so that the detected voltage changes according to the fluctuation of the power source voltage VDD.

Since an access transistor TMEM connected to a memory cell capacitor CO has different characteristics depending on whether the power source voltage VDD is low or high, there was a problem that the characteristics of the memory cannot be exhibited sufficiently according to the conditions of the power source voltage VDD.

Furthermore, with regard to the N-channel transistor TN152 in the voltage detection part 15-B, there is a possibility that a negative voltage will be applied to its source electrode depending on the value of the substrate potential VBB, and the possibility of currents flowing from the p-substrate to the n-type impurity diffusion area of the source is conceivable.

Therefore, in order to operate the voltage divider circuit including the P-channel transistor TP151, the N-channel transistor TN152 and the resistor R153 correctly, VBB needs to be applied to the p-type substrate of the N-channel transistor TN152, and for this purpose, it is necessary to provide an area where the substrate of the N-channel transistor TN152 is separated from the surrounding substrates.

Thus, the problems arise that the production steps for manufacturing the circuit become complicated, and that the arrangement of the voltage detection part in view of the layout configuration also becomes difficult.

SUMMARY OF THE INVENTION

Therefore, in light of the aforementioned problems, it is an object of the present invention to provide a semiconductor integrated circuit, in which a negative voltage generation circuit capable of supplying a memory cell transistor substrate with a stable negative voltage, independently of the fluctuation of a power source voltage or environmental conditions, the process conditions etc., is easily realized, and in which the data holding time of a memory can be secured sufficiently by maintaining the conditions under which leakage currents of the memory cell transistor are minimized and the power consumption is reduced, a test method for this semiconductor integrated circuit, and a recording device and communication equipment having this semiconductor integrated circuit.

To achieve the above object, a first semiconductor integrated circuit of the present invention is a semiconductor integrated circuit including a functional block and a negative voltage generation circuit for generating a predetermined negative voltage to be supplied to the functional block. The negative voltage generation circuit has a charge pump part, which converts a power source voltage into the predetermined negative voltage and outputs it, and a voltage detection part, which controls the output voltage of the charge pump part by comparing the output voltage of the charge pump part with a reference voltage and outputting the result of comparison to the charge pump part, wherein ground voltage is used as the reference voltage.

To achieve the above object, a second semiconductor integrated circuit of the present invention is a semiconductor integrated circuit including a memory block and a negative voltage generation circuit for generating a predetermined negative voltage to be supplied to the memory block. The negative voltage generation circuit has a charge pump part, which converts a power source voltage into the predetermined negative voltage and outputs it, and a voltage detection part, which controls the output voltage of the charge pump part by comparing the output voltage of the charge pump part with a reference voltage and outputting the result of comparison to the charge pump part, wherein ground voltage is used as the reference voltage.

According to the first and the second semiconductor integrated circuits, the output voltage of the charge pump part is controlled by comparing the output voltage from the charge pump part with the ground voltage, being the reference voltage that is not affected by the transistor characteristics due to the fluctuation of a power source voltage or environmental conditions, the process conditions etc., so that a stable negative voltage can be supplied to the functional block or to the memory block.

In the first and the second semiconductor integrated circuits, it is preferable that the charge pump part has a self-oscillating circuit, which generates a predetermined pulse signal only during a period in which an output signal from the voltage detection part is in an activated state, and a timing signal generation circuit, which converts the output pulse signal from the self-oscillating circuit into a timing signal. The voltage detection part has a constant voltage generation circuit, a measuring voltage generation circuit, which receives an output voltage from the constant voltage generation circuit and an output voltage from the charge pump part and generates a divided measuring voltage by resistive means, a first comparator for outputting the result of comparison after comparing the measuring voltage from the measuring voltage generation circuit with the ground voltage, and an output buffer circuit for amplifying the compared result from the first comparator and outputting it to the charge pump part.

According to the above configuration, the voltage detection part for controlling the output voltage of the negative voltage generation circuit includes the constant voltage generation circuit, so that the negative voltage can be output constantly against the fluctuation of the power source voltage.

Furthermore, in the first and the second semiconductor integrated circuits mentioned above, it is preferable that, among transistors included in the voltage detection part, all the voltage applied to substrates of N-channel transistors are set as ground voltage.

According to this configuration, in the voltage detection part, it is possible to realize a circuit configuration in which resistors are used in place of transistors in the circuit receiving the negative voltage from the charge pump part, and the substrate potential of the N-channel transistors is set as ground potential, and also a circuit configuration using the same p-type substrate as an ordinary logic circuit which does not require an independent substrate area can be realized. As a result, it is possible to enhance the degree of freedom with respect to the circuit arrangement and also to reduce the layout area.

Furthermore, in the first and the second semiconductor integrated circuits mentioned above, it is preferable that the voltage detection part has a voltage supplying circuit including a second comparator and a P-channel transistor interposed between the constant voltage generation circuit and the measuring voltage generation circuit. The voltage supplying circuit outputs a voltage based on the output voltage of the constant voltage generation circuit according to a configuration in which an output from the constant voltage generation circuit is supplied to an inverting input terminal of the second comparator, a power source voltage is supplied to a drain terminal of the P-channel transistor, an output from the second comparator is supplied to a gate terminal of the P-channel transistor, a source terminal of the P-channel transistor is connected to a non-inverting input terminal of the second comparator, and an output from the source terminal of the P-channel transistor is coupled to the measuring voltage generation circuit.

According to this configuration, without directly using the output voltage sent from the constant voltage generation circuit, by using the voltage replicated by a differential amplifier included in the second comparator, the fluctuating effect of the negative voltage generation circuit itself on the constant voltage generation circuit can be reduced.

Furthermore, in the first and the second semiconductor integrated circuits mentioned above, it is preferable that the first comparator has a first differential amplifier to a third differential amplifier. The measuring voltage is supplied to one input terminal of the first differential amplifier while ground voltage is supplied to the other input terminal, ground voltage is supplied to one input terminal of the second differential amplifier while the measuring voltage is supplied to the other input terminal, an output voltage of the first differential amplifier is supplied to one input terminal of the third differential amplifier while an output voltage of the second differential amplifier is supplied to the other input terminal, and the output voltages from the first and the second differential amplifiers have reversed phases.

According to this configuration, the first comparator is realized not as a single element but by combining three differential amplifiers, so that a high-speed output can be sent to the charge pump part against the voltage fluctuation of the negative voltage generation circuit. Specifically, in the case where a memory capacity is increased, fluctuation of the negative voltage is reduced, but in the case where only a small memory capacity is provided, the voltage fluctuation is large, and a quick response is required. According to the circuit configuration mentioned above, as for the change in the memory capacity, the voltage detection part can respond to a minute voltage change at a high speed, so that the dependency of the negative voltage fluctuation on the memory capacity can be reduced.

Furthermore, in the first and the second semiconductor integrated circuits mentioned above, it is preferable that the constant voltage generation circuit has first voltage regulation means for regulating an output voltage by changing an output current value through a change in the size of transistors included in a current mirror circuit, and that the measuring voltage generation circuit has second voltage regulation means for changing a measuring voltage by changing the resistance of the resistive means.

According to this configuration, the voltage regulation means are provided respectively for the constant voltage generation circuit and the resistors, independently of each other, so that a constant negative voltage output is secured against the change in the process conditions, and also the test and the regulation of the circuit become easier.

Furthermore, it is preferable that the resistive means include a first resistor to a nth resistor serially-connected to each other, and that the second voltage regulation means includes a first fuse to a nth fuse parallel-connected to each of the first resistor to the nth resistor. When the resistance of the first resistor parallel-connected to the first fuse is defined as R, the resistance of the nth resistor parallel-connected to the nth fuse is set as $2^{(n-1)}$ times R. The second voltage regulation means changes the measuring voltage by disconnecting at least one of the first to nth fuses and changing increments of the resistance from R to $2^{(n-1)}$ times R.

According to this configuration, the resistance regulated by the fuses parallel-connected to each resistor is set as the power of two of a minimum step. Therefore, in the case where the number of fuses is n, it is possible to regulate the change width of the voltage from 0 time to $2^{(n-1)}$ times of the minimum step.

Furthermore, in the first and the second semiconductor integrated circuits mentioned above, it is preferable that the first comparator of the voltage detection part includes transistors having a thicker gate oxide film than that of transistors used for a circuit in a preceding stage of the first comparator in the voltage detection part.

According to this configuration, even when the voltage sent to the first comparator fluctuated abruptly, a dielectric breakdown of transistor elements can be prevented from occurring.

Furthermore, in the first and the second semiconductor integrated circuits mentioned above, it is preferable that the output buffer circuit of the voltage detection part has inverters in a plurality of stages where an inverter in a first stage includes transistors having a thicker gate oxide film than that of each inverter in other stages.

According to this configuration, for the inverter in the first stage whose voltage changes slowly, transistors having a thick gate oxide film are used to reduce a capacitive load of gates. On the other hand, for the second and following inverters whose voltage changes quickly enough, transistors having a thinner oxide film than that in the first stage are used, so that the response speed of the entire circuit can be improved.

Furthermore, in the first semiconductor integrated circuit, it is preferable that the functional block includes a plurality of functional blocks respectively having different functions, and that the negative voltage generation circuit includes a plurality of negative voltage generation circuits for generating different predetermined negative voltages to be supplied to each of the plurality of functional blocks and a constant voltage generation circuit common to each of the plurality of negative voltage generation circuit.

Alternatively, it is preferable that the functional block includes a plurality of functional blocks respectively having different functions, and that the negative voltage generation circuit includes at least one negative voltage generation circuit for generating a predetermined negative voltage to be supplied to each of the plurality of functional blocks. The semiconductor integrated circuit further includes at least one positive voltage generation circuit for generating a predetermined positive voltage to be supplied to each of the plurality of functional blocks, and a constant voltage generation circuit common to each of the at least one negative voltage generation circuit and the at least one positive voltage generation circuit.

According to the above configuration, even in the case where the scaling of a circuit to be integrated as a system LSI becomes larger, and the types of functional blocks are diversified, the degree of freedom for the circuit arrangement can be enhanced, and also the layout area can be reduced.

To achieve the aforementioned object, a first method for inspecting a semiconductor integrated circuit of the present invention is a test method for the first or the second semiconductor integrated circuit mentioned above, which is characterized by the steps of performing a test by externally applying a predetermined voltage to the functional block or the memory block, judging whether the functional block or the memory block is defective based on the results of the test, and supplying a predetermined negative voltage from the negative voltage generation circuit only for the functional block or the memory block judged as non-defective.

To achieve the aforementioned object, a second method for inspecting a semiconductor integrated circuit of the present invention is a test method for the first or the second semiconductor integrated circuit mentioned above, which is characterized by the steps of performing a test by externally applying a predetermined voltage to be output by the negative voltage generation circuit to the functional block or the memory block, judging whether the functional block or the memory block is defective based on the results of the test and recording voltage conditions optimizing operating conditions of the functional block or the memory block, connecting the negative voltage generation circuit whose output voltage is regulated to the voltage conditions only to the functional block or the memory block judged as non-defective, and performing test items of the functional block or the memory block by supplying a negative voltage.

According to the first and the second test methods, particularly for test of a memory, the characteristic test of a memory element such as a pause time is carried out in advance, and only the circuits whose test results satisfy the specifications become the objects of the test, so that, compared with the test method for inspecting all the circuits, the number of circuits to be inspected can be reduced, and the test time can be shortened.

To achieve the above object, a recording device according to the present invention is characterized in that the recording device has the first or the second semiconductor integrated circuit, and that the recording device includes a recording system using at least one selected from light and magnetism.

To achieve the above object, communication equipment according to the present invention is characterized in that the communication equipment has the first or the second semiconductor integrated circuit.

According to the above configuration, by applying the negative voltage generation circuit, the data holding time, that is, the pause time of a DRAM can be increased, so that the refresh operation cycle can be elongated. As a result, the power consumption of the DRAM is reduced, and a stable circuit operation can be achieved.

DESCRIPTION OF THE PREFERRED EMBODIMENTS

Hereinafter, the preferred embodiments of the present invention will be described with reference to the drawings.

First Embodiment

Figure 1:
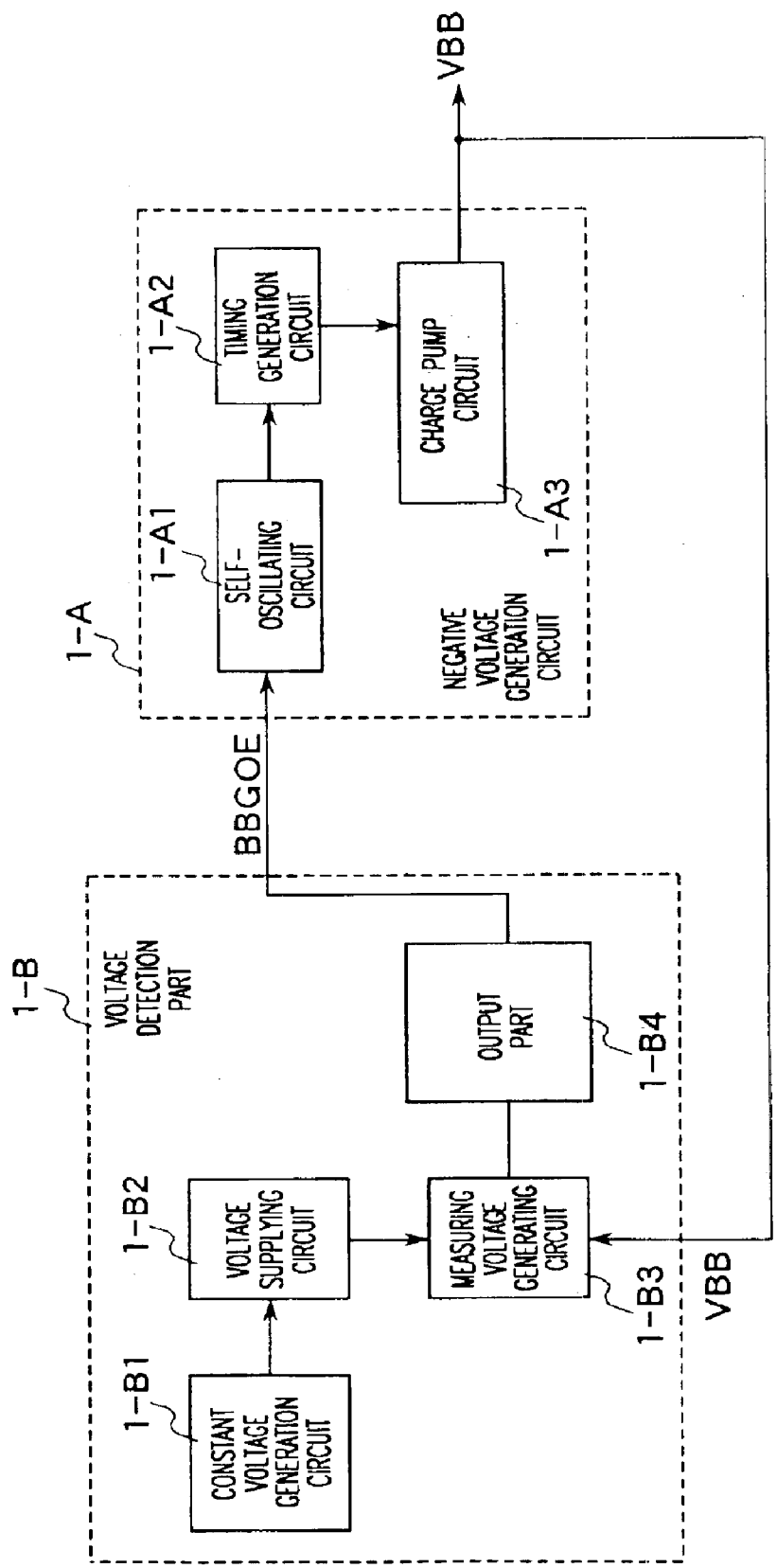
FIG. 1 is a block diagram showing a configuration example of a negative voltage generation circuit included in a semiconductor integrated circuit according to a first embodiment of the present invention.

FIG. 1 is a block diagram showing a configuration example of a negative voltage generation circuit included in a semiconductor integrated circuit according to a first embodiment of the present invention.

In FIG. 1, a negative voltage generation circuit includes a negative voltage generation part 1-A (a charge pump part) and a voltage detection part 1-B, and the negative voltage generation part 1-A, whose operation is controlled by a control signal BBGOE fed from the voltage detection part 1-B, keeps a substrate voltage VBB of transistors included in a functional block at a predetermined negative voltage. Here, the negative voltage generation part 1-A includes a self-oscillating circuit 1-A1, which operates during a period in which the control signal BBGOE fed from the voltage detection part 1-B is in a logic "H" level, a timing generation circuit 1-A2 and a charge pump circuit 1-A3 for generating a negative voltage.

The voltage detection part 1-B includes a constant voltage generation circuit 1-B1, a voltage supplying circuit 1-B2, a measuring voltage generation circuit 1-B3 and an output part 1-B4.

Figure 2:
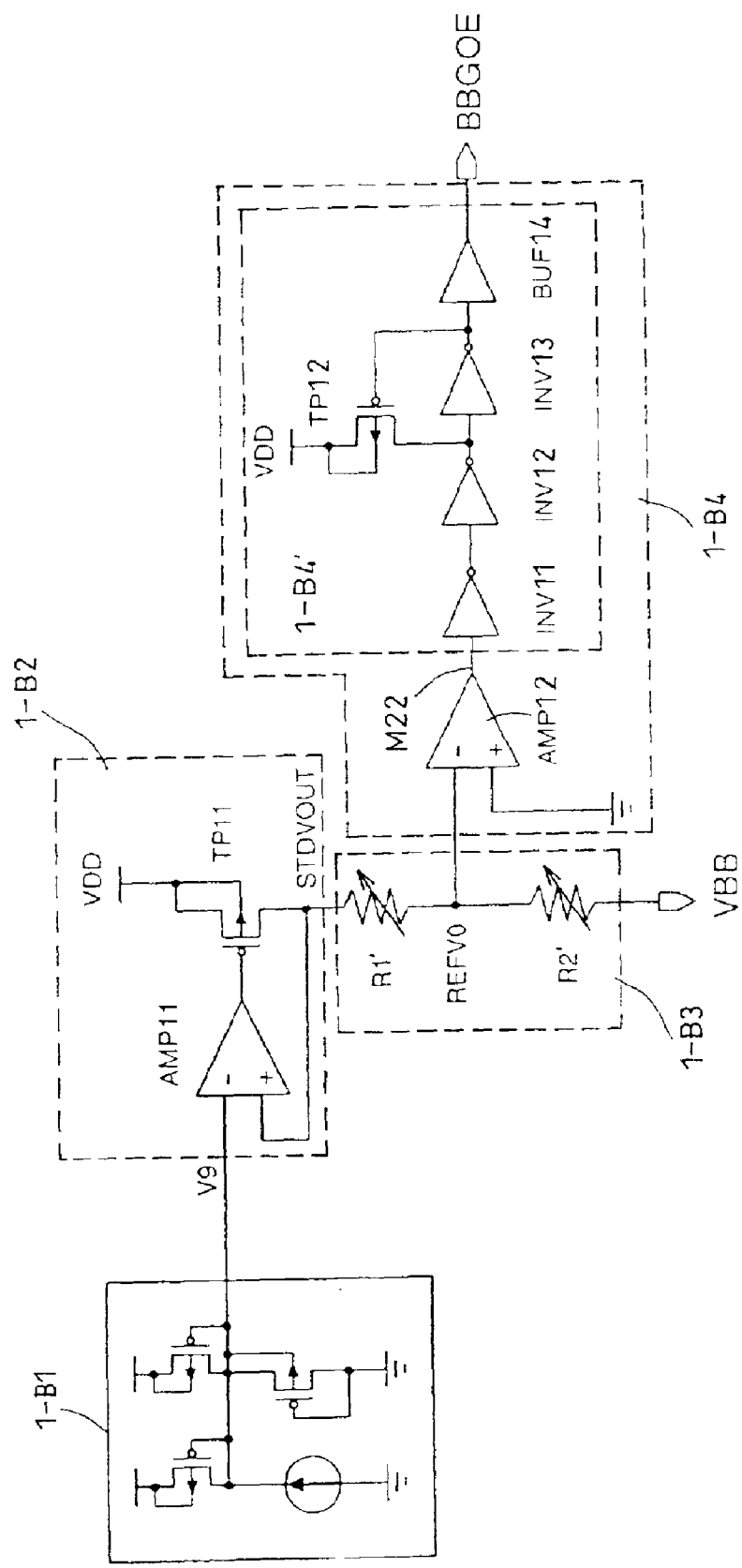
FIG. 2 is a circuit diagram schematically showing a configuration example of a voltage detection part 1-B.

FIG. 2 is a circuit diagram schematically showing a configuration example of the voltage detection part 1-B.

In FIG. 2, the voltage supplying circuit 1-B2, which has a differential amplifier AMP11 (a second comparator) and a P-channel transistor TP11, receives a constant voltage from the constant voltage generation part 1-B1 and replicates the voltage.

The measuring voltage generation circuit 1-B3 including variable resistors R1' and R2' divides a predetermined constant voltage sent from the voltage supplying circuit 1-B2 and the substrate voltage VBB sent from the negative generation part 1-A and outputs it as a voltage REFV0.

The output part 1-B4 includes a differential amplifier AMP12 (a first comparator), which compares the voltage REFV0 sent from the measuring voltage generation circuit 1-B3 with ground voltage VSS being a reference voltage to judge the relative size between them, and an output buffer circuit 1-B4'. The output buffer circuit 1-B4', which amplifies a slowly changing output signal M22 from the differential amplifier AMP12, includes a chain of inverters INV11, INV12, INV13, a buffer BUF14 for generating the control signal BBGOE and a Schmitt trigger circuit by a P-channel transistor set TP12, which generates hysteresis characteristics by making a difference in response to the change from the "H" level to the "L" level, and from the "L" level to the "H" level by applying an output from INV 13 to the gate.

Figure 3:
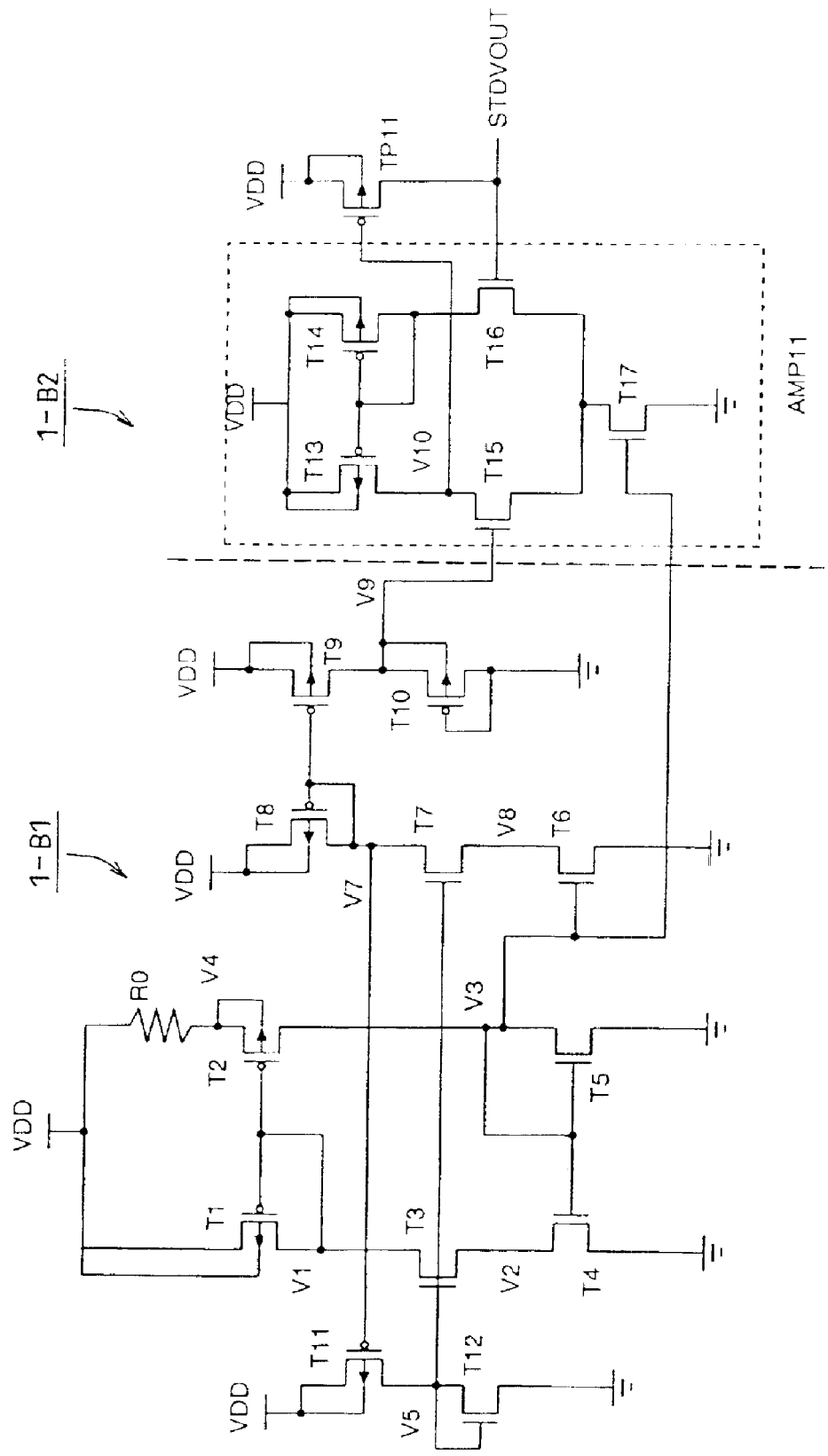
FIG. 3 is a circuit diagram showing a configuration of a constant voltage generation circuit 1-B1 and that of a voltage supplying circuit 1-B2.

FIG. 3 is a circuit diagram showing the configuration of the constant voltage generation circuit 1-B1 and that of the voltage supplying circuit 1-B2 shown in FIG. 1. In FIG. 3, for the explanatory purpose, a part which is connected to N-channel transistors T4 and T5, included in the constant voltage generation circuit 1-B1 where the regulation of an output voltage is performed by a current regulation achieved by changing the transistor size, is omitted, but will be described later in reference to FIG. 4.

In FIG. 3, P-channel transistors T1 and T2 and the N-channel transistors T4 and T5 in the constant voltage generation circuit 1-B1 respectively construct a current mirror circuit with the same gate width and the same gate length. Here, when the gate width and the gate length of the P-channel transistors T1 and T2 are determined as WP1 and LP1, and the gate width and the gate length of the N-channel transistors T4 and T5 are determined as WN1 and LN1, a current flowing through a path including the P-channel transistor T1 and the N-channel transistor T4 is determined as I1 and a current flowing through a path including the P-channel transistor T2 and the N-channel transistor T5 is determined as I2, the P-channel transistor T1 and the N-channel transistor T5 respectively satisfy the following relationships:

$$I1=-(\beta/2)\cdot(WP1/LP1)\cdot(V1-VTP)^2$$

$$I2=-(\beta/2)\cdot(WN1/LN1)\cdot(V3-VTN)^2$$

In the above-mentioned formula, however, when a threshold voltage of the P-channel transistor is determined as VT, it is defined as VTP=VT+VDD.

Furthermore, as for resistance R0, since it is R0·I2=VDD−V4, the current I2 tends to increase along with the rise in the power source voltage VDD. By taking the relationship of the current flowing through the N-channel transistor T5 into consideration, a drain or a gate voltage V3 of the T5 will be raised, and a current I3 flowing through a path of transistors T6, T7 and T8 shows the tendency to decrease. If the current I3 decreases, a voltage V7 rises due to the current relationship with T8, and a current I4 flowing through a path of T11 and T12 will decrease. If the current I4 decreases, a voltage V5 will decrease due to the current relationship with T8, and as a result, the current I1 decreases. The decrease in the current I1 leads the voltage V1 to rise due to the relationship of the current flowing through T1 and serves to reduce the current I2.

To summarize the explanation mentioned above, due to the function of the current mirror circuits and the transistors T11, T12 controlling the voltage, it is effected to extinguish the change in the current and in the voltage of the entire system against the increase and the decrease in the power source voltage VDD. Since the voltage V7 is stabilized, the current flowing through T9 and T10 becomes constant, so that an output voltage V9 from the constant voltage generation circuit 1-B1 has a constant value, which is determined by the size of the P-channel transistor T10.

The constant voltage V9 generated by the constant voltage generation circuit 1-B1 is applied to an inverting input terminal of the differential amplifier AMP11 in the voltage supplying circuit 1-B2, and an output STDVOUT equal to the input voltage V9 is replicated by a feedback achieved by connecting an output of the differential amplifier AMP11 to a gate terminal of the P-channel transistor TP11, connecting a drain to the power source voltage VDD, and connecting a source to the output STDVOUT and a non-inverting input terminal of the differential amplifier AMP11.

Next, referring to FIG. 4, first voltage regulation means in the constant voltage generation circuit 1-B1 will be explained.

Figure 4:
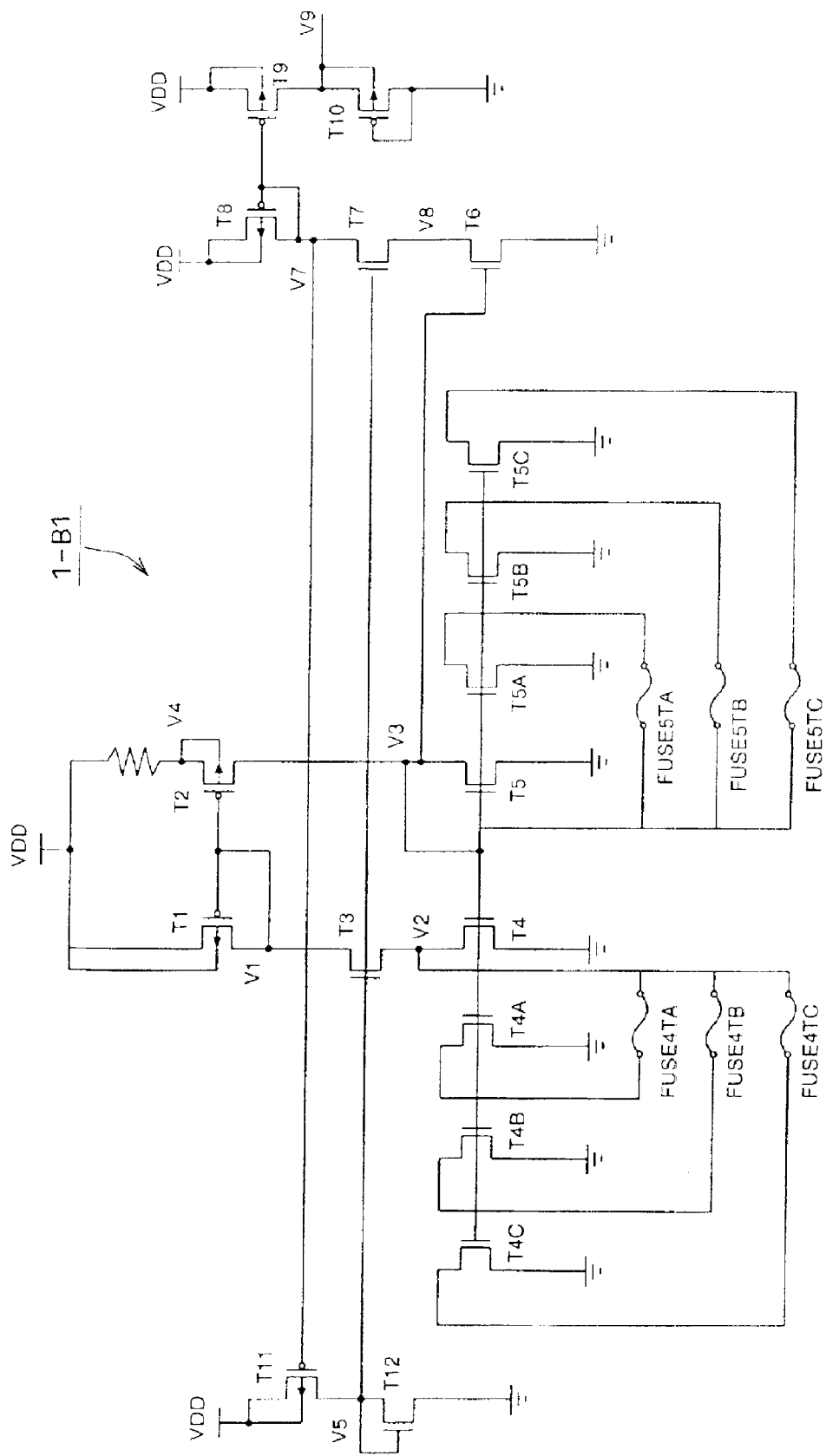
FIG. 4 is a circuit diagram showing a detailed configuration of the constant voltage generation circuit 1-B1.

FIG. 4 is a detailed circuit diagram of the constant voltage generation circuit 1-B1.

The constant voltage generation circuit 1-B1 has, as shown in FIG. 4, respectively three fuses FUSE4TA, FUSE4TB, FUSE4TC and three fuses FUSE5TA, FUSE5TB, FUSE5TC on the right and left sides of the current mirror circuit, and the constant voltage generation circuit 1-B1 has the function of performing a voltage regulation by changing the currents on the right and left sides through disconnection of the fuses and thus through a change in the size of the transistors operating as transistors T4+T4A+T4B+T4C and transistors T5+T5A+T5B+T5C in a non-disconnected state, and the voltages V5 and V7 at the stable point are changed.

Since the disconnection of the three fuses FUSE5TA, FUSE5TB, FUSE5TC respectively provided for drain terminals of the transistors T5A, T5B, T5C on the right side of the current mirror circuit has the function of increasing a ratio of the current I3 relative to the current I2, the voltage V7 goes down due to the increase of the current I3, and the current flowing through the transistors T9 and T10 is increased, and thus, the output voltage V9 is raised.

On the other hand, when the three fuses FUSE4TA, FUSE4TB, FUSE4TC respectively provided for drain terminals of the transistors T4A, T4B, T4C on the left side of the current mirror circuit are disconnected, a ratio of the current I1 relative to the current I2 is reduced. Therefore, the voltage V1 is stabilized at a higher level than in the non-disconnected state, and the current I2 also is reduced, so that the voltage V7 in the stable state rises, and the output voltage V9 goes down.

Next, referring to FIG. 5, second voltage regulation means in the measuring voltage generation circuit 1-B3 will be explained.

Figure 5:
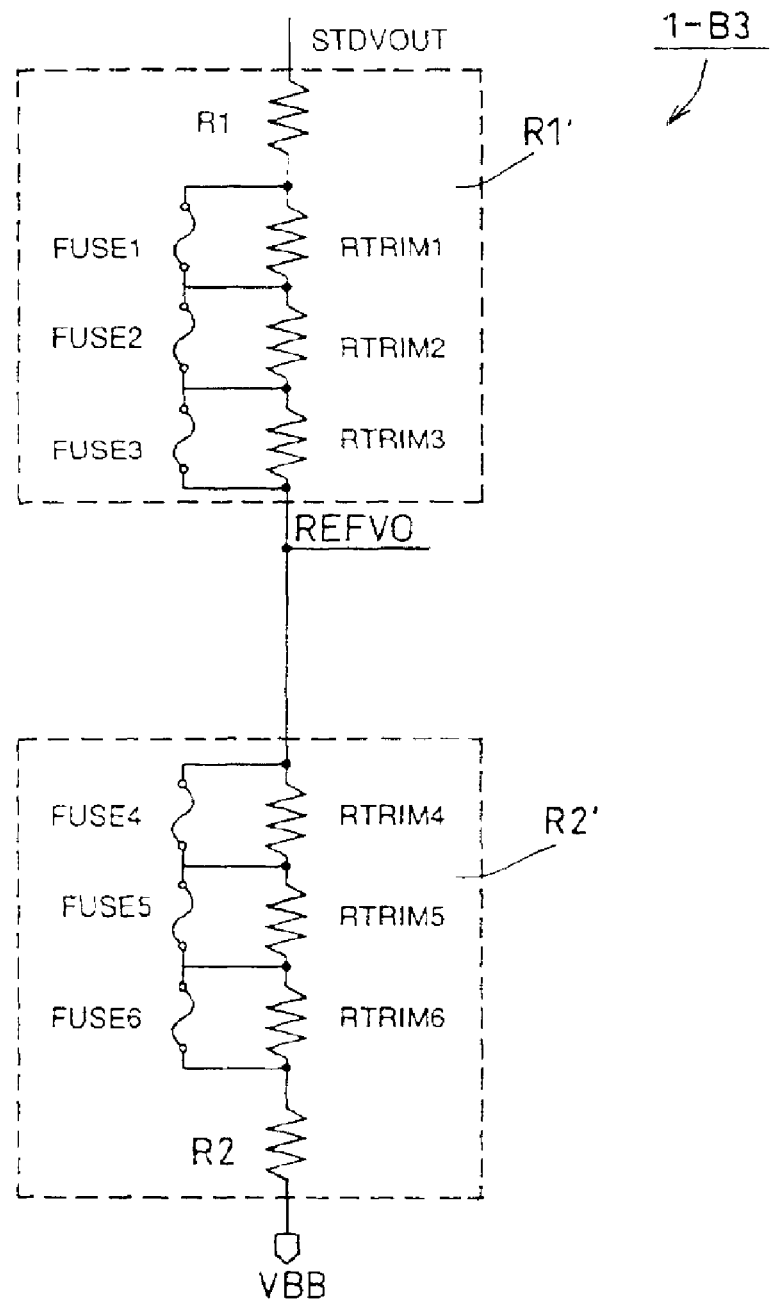
FIG. 5 is a circuit diagram showing a detailed configuration of a measuring voltage generation circuit 1-B3.

FIG. 5 is a circuit diagram showing the configurations of the variable resistors R1' and R2' included in the measuring voltage generation circuit 1-B3.

In FIG. 5, with regard to resistors RTRIM1, RTRIM2 and RTRIM3 respectively parallel-connected to fuses FUSE1, FUSE2 and FUSE3, a resistance of the resistor RTRIM2 is determined to be twice as much as a resistance ($R_1$) of the resistor RTRIM1, and a resistance of the resistor RTRIM3 is determined to be four times as much as the resistance ($R_1$) of the resistor RTRIM1.

Similarly, with regard to resistors RTRIM4, RTRIM5 and RTRIM6 respectively parallel-connected to fuses FUSE4, FUSE5 and FUSE6, a resistance of the resistor RTRIM5 is determined to be twice as much as a resistance ($R_4$) of the resistor RTRIM4, and a resistance of the resistor RTRIM6 is determined to be four times as much as the resistance ($R_4$) of the resistor RTRIM4.

Accordingly, it is possible to set the resistance at the minimum of $R_1$, $R_4$ and at the maximum of $7 \times R_1$, $7 \times R_4$, and therefore, the voltage setting can be performed for the respective fuses in 8 ways each, for a total of 16 ways.

The voltage setting by the resistors is not affected much by a change in the characteristics caused by temperature and process conditions etc., so that it is possible to specify the fuses to be disconnected in advance from a difference with the targeted setting voltage, and the time required for setting can be shortened.

Next, referring to FIG. 6, the operation of the differential amplifier AMP12 (the first comparator) will be explained schematically.

Figure 6:
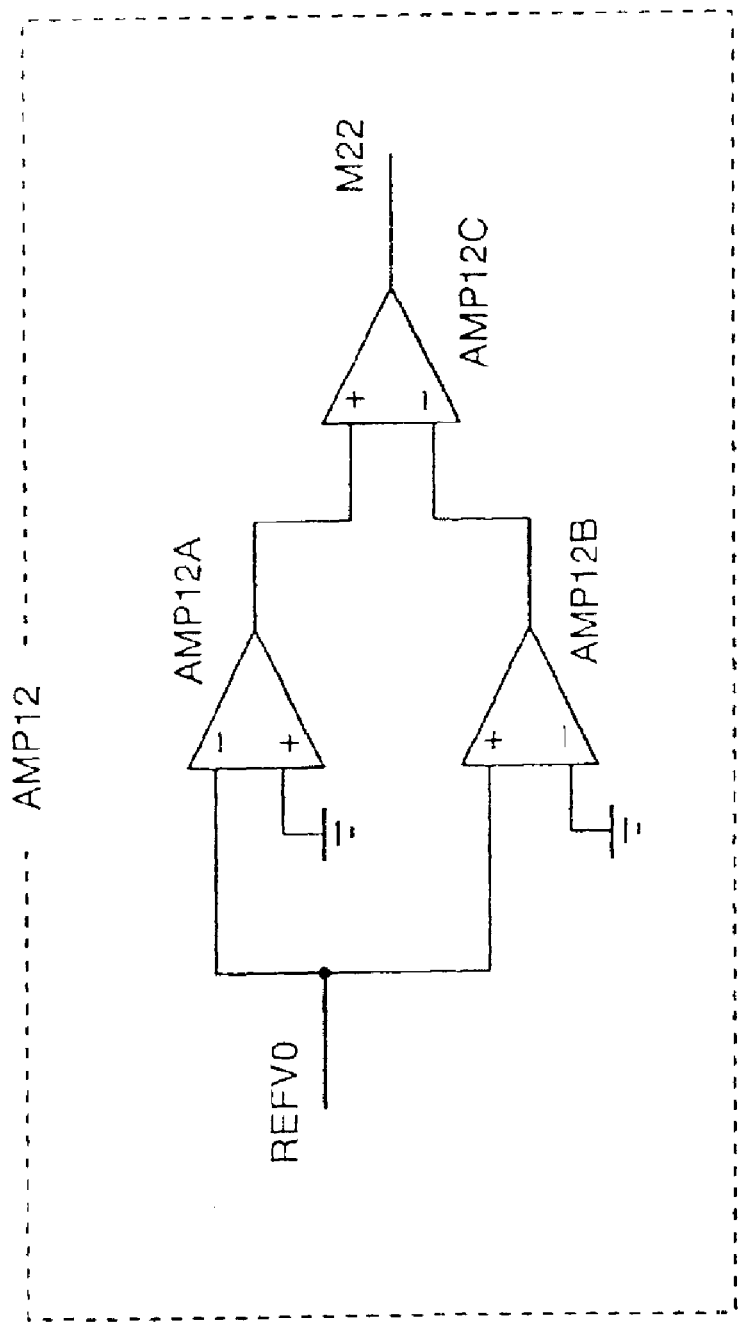
FIG. 6 is a circuit diagram equivalently showing a configuration of a differential amplifier AMP12.

FIG. 6 is an equivalent circuit diagram of the differential amplifier AMP12. As shown in FIG. 6, the differential amplifier 12 includes three pieces of differential amplifiers: AMP12A, AMP12B and AMP12C.

A voltage REFV0, whose voltage is divided from the constant voltage STDOUT and the negative voltage VBB, is applied to an inverting input terminal of AMP12A, and ground voltage VSS is applied to its non-inverting input terminal. Furthermore, a measuring voltage REFV0 is applied to a non-inverting input terminal of the AMP12B, and ground voltage VSS is applied to its inverting input terminal. By applying an output from AMP12A to a non-inverting input terminal of AMP12C and an output from AMP12B to an inverting input terminal of AMP12C, the voltage level of an output M22 from AMP12C descends when it is REFV0>VSS, whereas the voltage level of the output M22 rises when it is REFV0<VSS. Therefore, the differential amplifier AMP12 as a whole is equivalent to the configuration in which REFV0 is applied to an inverting input terminal and VSS is applied to a non-inverting input terminal.

Next, referring to FIG. 7, the operation of the differential amplifier AMP12 will be explained in detail.

Figure 7:
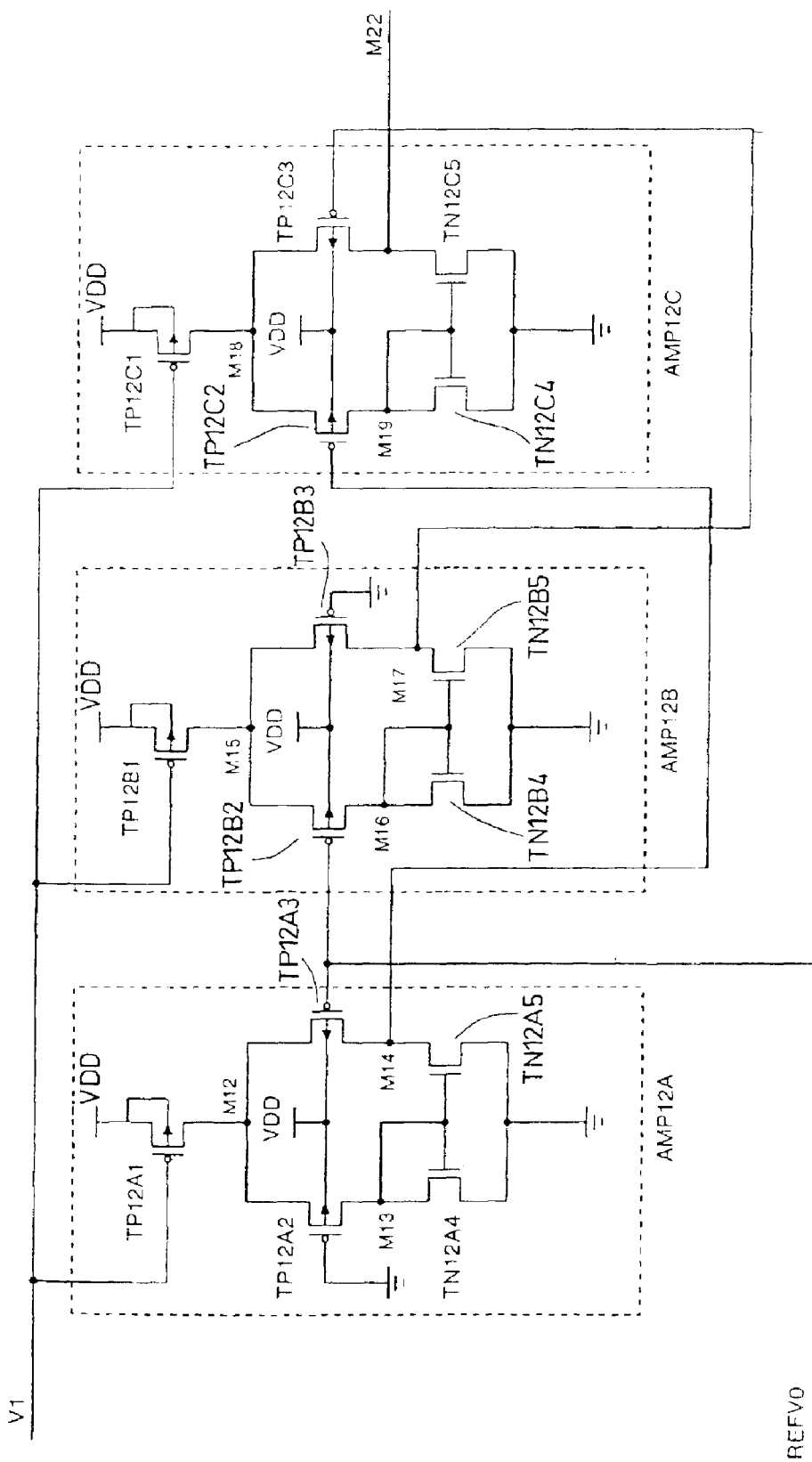
FIG. 7 is a circuit diagram showing a detailed configuration of the differential amplifier AMP12.

FIG. 7 is a detailed circuit diagram of the differential amplifier AMP12.

In FIG. 7, in order to provide AMP12A and AMP12B respectively with the same capacity and the characteristics, the corresponding transistors have the same size in this configuration. The voltage V1 generated by the current mirror circuit of the constant voltage generation circuit 1-B1 shown in FIG. 3 is input to gates of transistors TP12A1, TP12B1 and TP12C1 respectively forming the current source of AMP12A, AMP12B and AMP12C.

In AMP12A, when the voltage level of the measuring voltage REFV0 rises, the current flowing through TP12A3 is reduced, and by this reduction, the current flowing through TP12A2 increases. Here, TN12A4 and TN12A5 form a current mirror circuit, and when the current flowing through TN12A4, that is, the current flowing through TN12A2 increases and the current flowing through TN12A4 is reduced by this increase, it is shifted to the state in which the voltage level of an output M14 will be descending. On the other hand, when the voltage level of the measuring voltage REFV0 descends, on the contrary thereto, it is shifted to the state in which the voltage level of the output M14 will be rising.

Furthermore, in AMP12B, since the measuring voltage REFV0 is input to a gate of TP12B2, the voltage level of an output M17 rises, accompanied by the rise in the voltage level of the measuring voltage REFV0, and on the contrary, the voltage level of an output M17 descends due to the fall in the voltage level of the measuring voltage REFV0.

Thus, in AMP12C, based on the results of the output from AMP12A and AMP12B, the voltage level of the output M22 rises, accompanied by the rise of the measuring voltage REFV0, and the voltage level of the output M22 descends, accompanied by the fall of the measuring voltage REFV0.

Here, according to the present embodiment, gates of transistors TP12A2, TP12B3 respectively are connected to the ground voltage VSS, so that, differently from the voltage generated in the constant voltage source, they are not affected by the process conditions. Thus, it is possible to perform a constant and stable voltage comparison in the differential amplifier 12.

Furthermore, in order to prevent a dielectric breakdown from occurring in transistor elements in the case where the change of the negative voltage VBB is steep, the circuit included in AMP12 has transistors with a thicker gate oxide film than that of transistors in other circuits.

Figure 8:
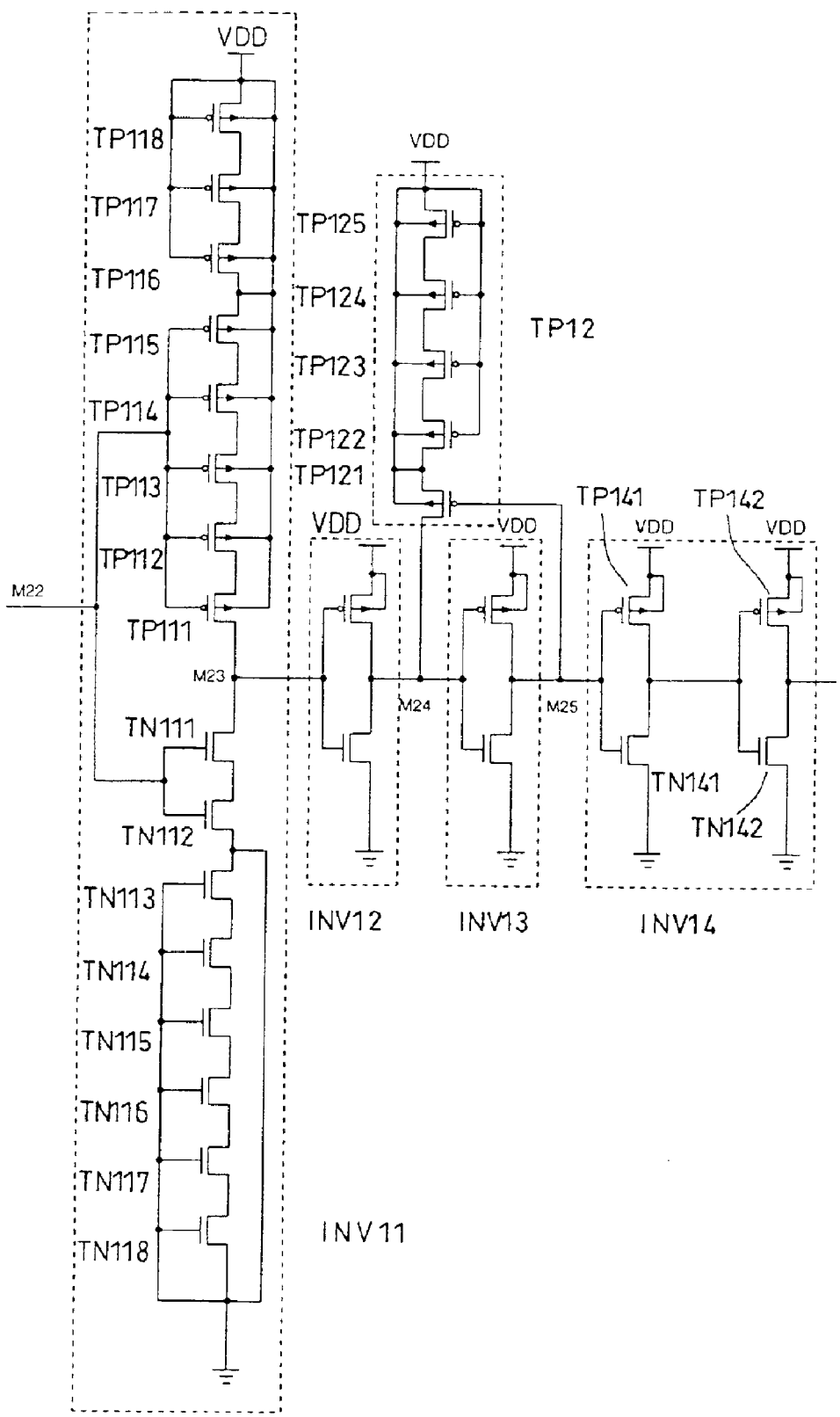
FIG. 8 is a circuit diagram showing a detailed configuration of an output buffer circuit 1-B4'.

FIG. 8 is a detailed circuit diagram showing the configuration of an output buffer stage, which receives the output M22 of the differential amplifier AMP12 and generates the control signal BBGOE, in the output part 1-B4 shown in FIG. 1.

In FIG. 8, since the output M22 from the differential amplifier AMP12 changes slowly, in the first stage inverter INV11 which receives the output M22, transistors with a thicker gate oxide film than that of transistors forming the inverters INV12, INV13, and the buffer BUF14 in other stages and the P-channel transistor set TP12 are used, so that the capacitive load of the gates is reduced, and the effect by a delay in the response speed is relieved.

The first stage inverter INV11 includes eight N-channel transistors TN111 to TN118 and eight P-channel transistors TP111 to TP118. TN111 and TN112 are operated on the N-channel side, and TP111 to TP115 are operated on the P-channel side, and the rest of the transistors are provided in reserve for enabling regulation of a switching level of INV11 by changing a wiring mask on the uppermost layer.

The P-channel transistor set TP12, used for giving hysteresis characteristics to a switching level of INV12, functions such that, when a voltage level of M25 is about to go down, the switching level of INV12 determining the voltage level of M24 is raised by the increase in the current flowing through TP121 within TP12, and the voltage change in the voltage level of M25 going down and approaching to the "L" level is prevented. Here, only TP121 is operated, and the other four transistors TP122 to TP125 are provided in reserve for changing the width of hysteresis by changing the number of transistors used by the mask on the uppermost layer.

In the buffer BUF14, to secure sufficient output current for the transistors in the negative voltage generation part 1-A, which supplies the control signal BBGOE, transistors TP142 and TN142 having a larger gate width than transistors TP141 and TN141 are used.

As mentioned above, according to the present embodiment, by using the output voltage from the constant voltage generation circuit 1-B1 as the reference voltage for the negative voltage VBB to be applied to the substrate, the dependency of the substrate voltage on the power source voltage can be eliminated, and at the same time, by setting the standard voltage of the differential amplifier used for detection of the substrate voltage to the ground voltage VSS, the stable negative voltage VBB can be supplied to the memory cell transistor substrate, even against any of the fluctuation of the power source voltage or the environmental temperature and the process conditions etc.

Moreover, by providing two voltage regulation means independently in two portions of the constant voltage generation circuit 1-B1 and the measuring voltage generation circuit 1-B3, it is now possible to set the control signal BBGOE optimally, after performing the regulation for outputting the constant voltage from the constant voltage generation circuit 1-B1 as an appropriate value, by changing the voltage divided from this appropriate constant voltage and the negative voltage VBB through the measuring voltage generation circuit 1-B3.

Second Embodiment

Figure 9:
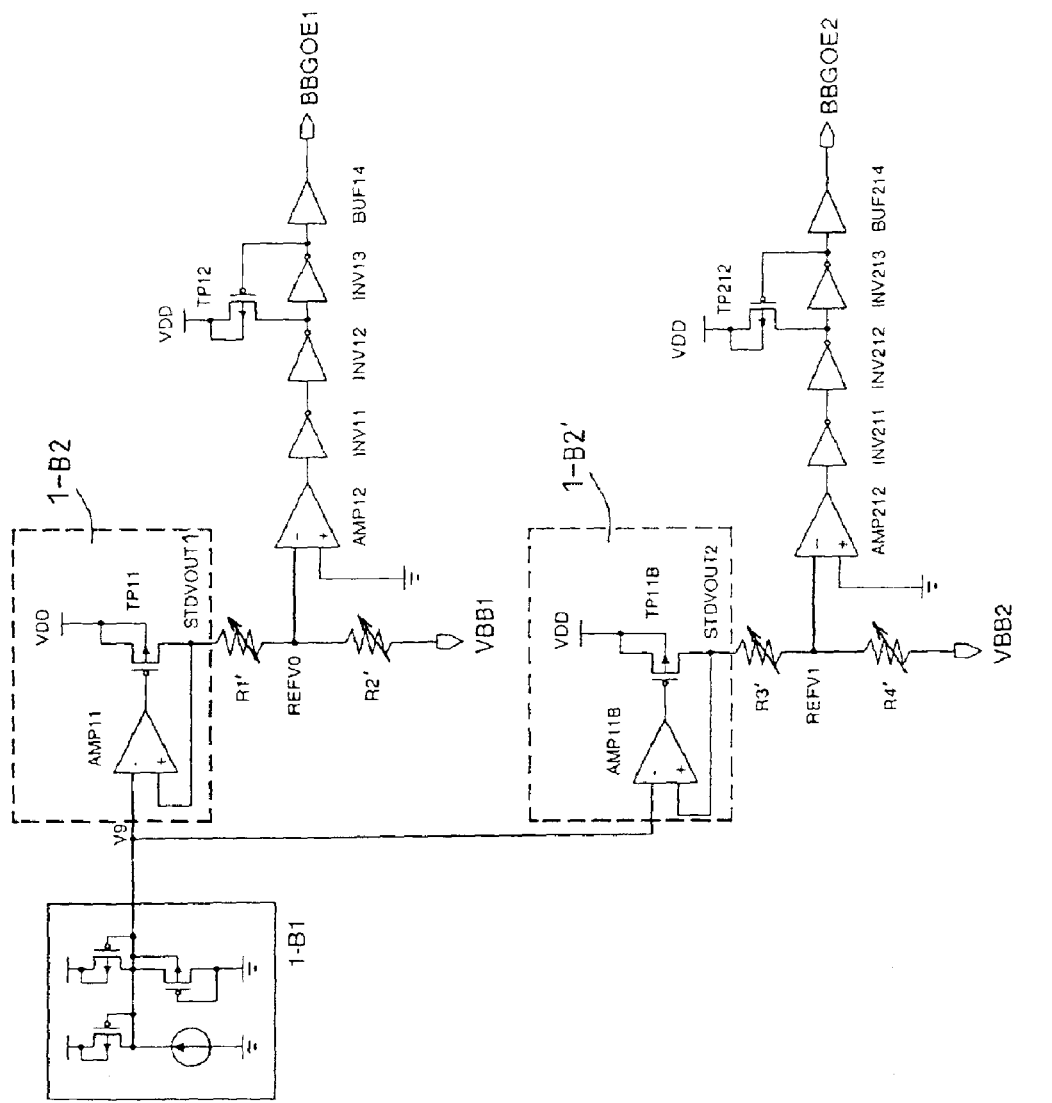
FIG. 9 is a block diagram partially showing a configuration example of a negative voltage generation circuit included in a semiconductor integrated circuit according to a second embodiment of the present invention.

FIG. 9 is a block diagram partially showing a configuration example of a negative voltage generation circuit included in a semiconductor integrated circuit according to a second embodiment of the present invention.

As shown in FIG. 9, in the present embodiment, by using a constant voltage generation circuit 1-B1 common to a first voltage supplying circuit 1-B2, which includes a differential amplifier AMP11 and a P-channel transistor TP11, and to a second voltage supplying circuit 1-B2', which includes a differential amplifer AMP11B and a P-channel transistor TP11B, a plurality of voltage detection parts that can output a first control signal BBGOE1 and a second control signal BBGOE2 are formed.

First, when a first negative voltage controlled by the first control signal BBGOE1 from the first voltage detection part is determined as VBB1 and a constant voltage output used in the first voltage detection part is determined as STDVOUT1, the control system is stabilized when a voltage REFV0 applied to an inverting input terminal of AMP12 becomes equal to the ground voltage VSS applied to its non-inverting input terminal, that is, when it is REFV0=0V, so that the first negative voltage VBB1 is expressed by the following formula:

$$VBB1 = -(R2'/R1') \cdot STDVOUT1$$

Next, when a second negative voltage controlled by the second control signal BBGOE2 from the second voltage detection part is determined as VBB2 and a constant voltage output used in the second voltage detection part is determined as STDVOUT2, the control system is stabilized when a voltage REFV1 applied to an inverting input terminal of AMP212 becomes equal to the ground voltage VSS applied to its non-inverting input terminal, that is, when it is REFV1=0V, so that the second negative voltage VBB2 is expressed by the following formula:

$$VBB2 = -(R4'/R3') \cdot STDVOUT2$$

In this way, the first negative voltage VBB1 and the second negative voltage VBB2 respectively are determined by a resistance ratio of R1' to R2' and a resistance ratio of R3' to R4'.

According to the present embodiment, when a circuit requiring a negative voltage other than memory cells in a DRAM is included in an integrated circuit, a constant voltage generation circuit can be shared by a plurality of voltage detection parts so as to reduce the layout area.

Third Embodiment

Figure 10:
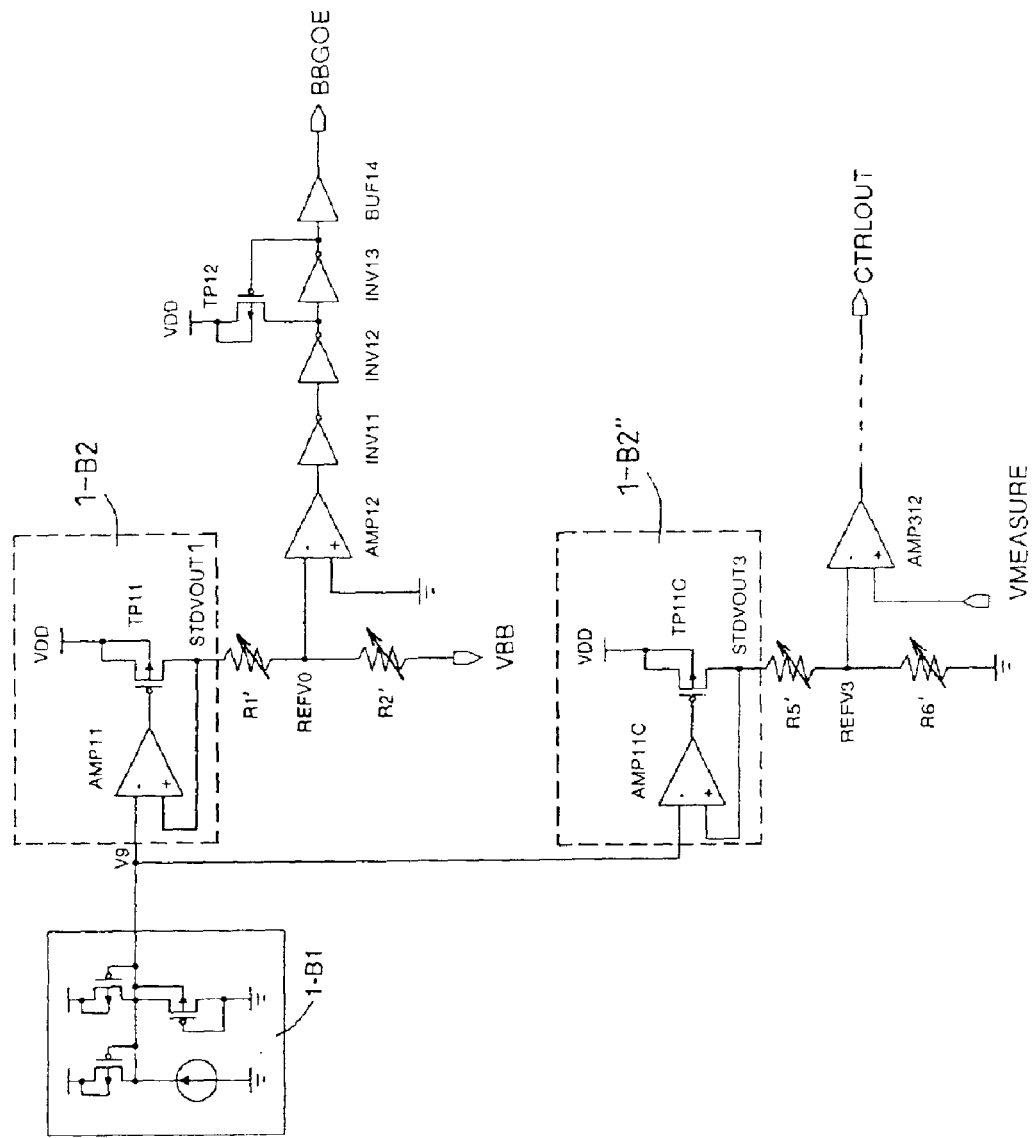
FIG. 10 is a block diagram partially showing a configuration example of a negative voltage generation circuit included in a semiconductor integrated circuit according to a third embodiment of the present invention.
Figure 11:
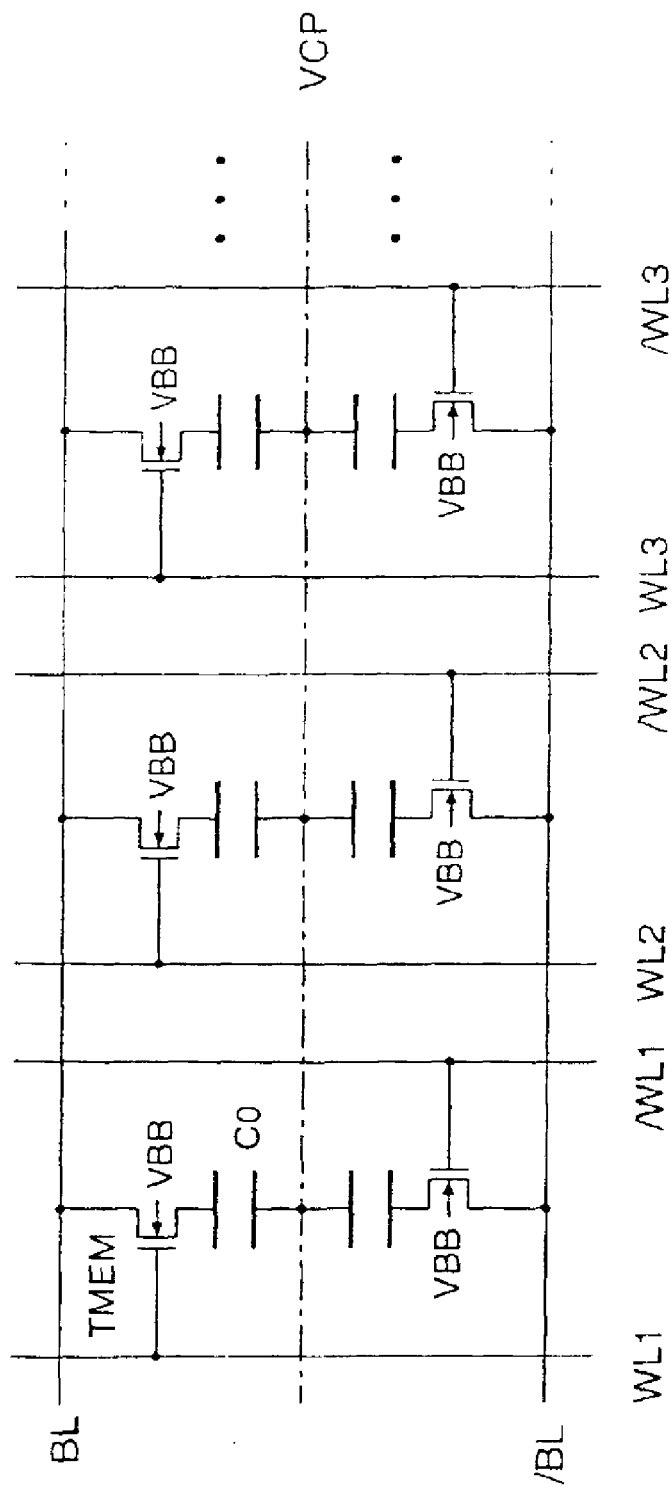
FIG. 11 is a circuit configuration diagram of a memory cell part in a DRAM.
Figure 12:
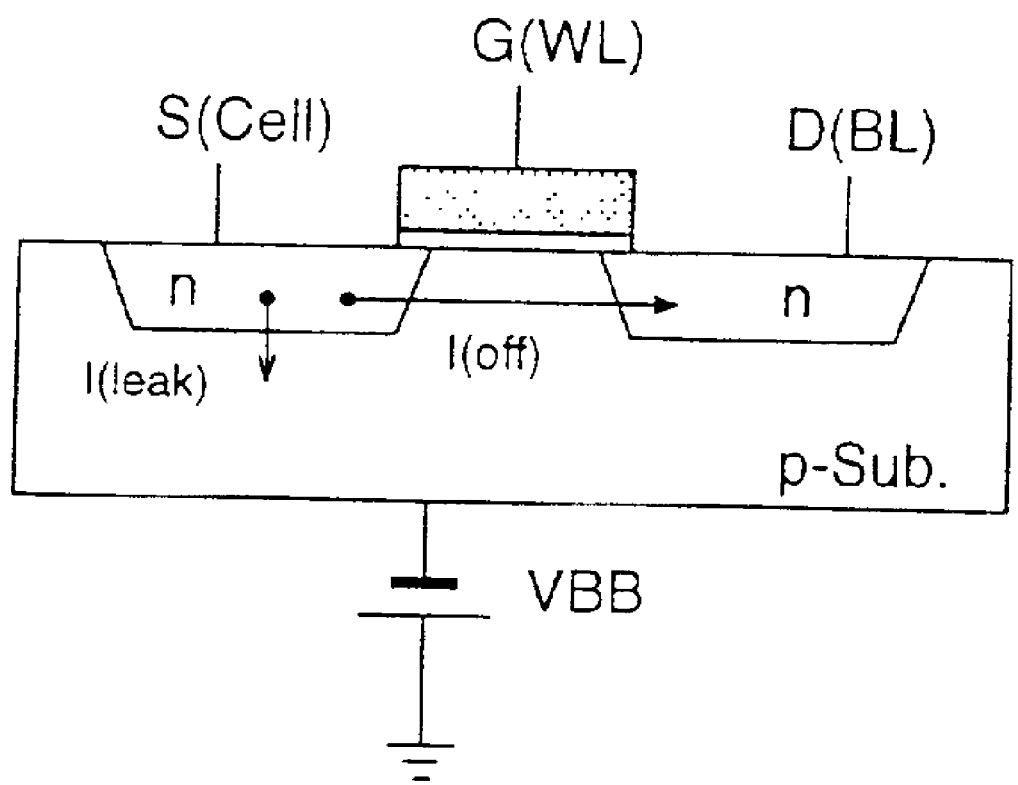
FIG. 12 is a cross-sectional view showing the structure of a memory cell transistor.
Figures 13A, 13B:
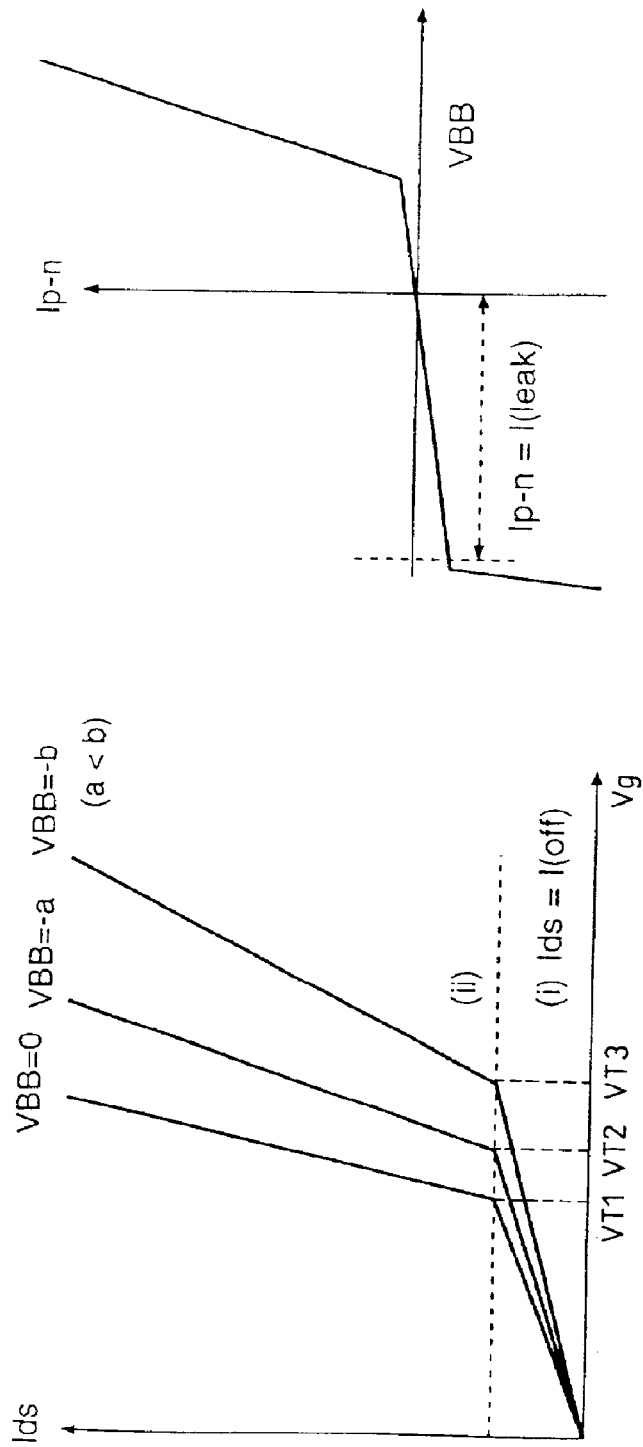
FIG. 13A is a graph showing the dependency of leakage currents I (off) on a substrate voltage VBB in the memory cell transistor.
FIG. 13B is a graph showing the dependency of leakage currents I (leak) on the substrate voltage VBB in the memory cell transistor.
Figure 14:
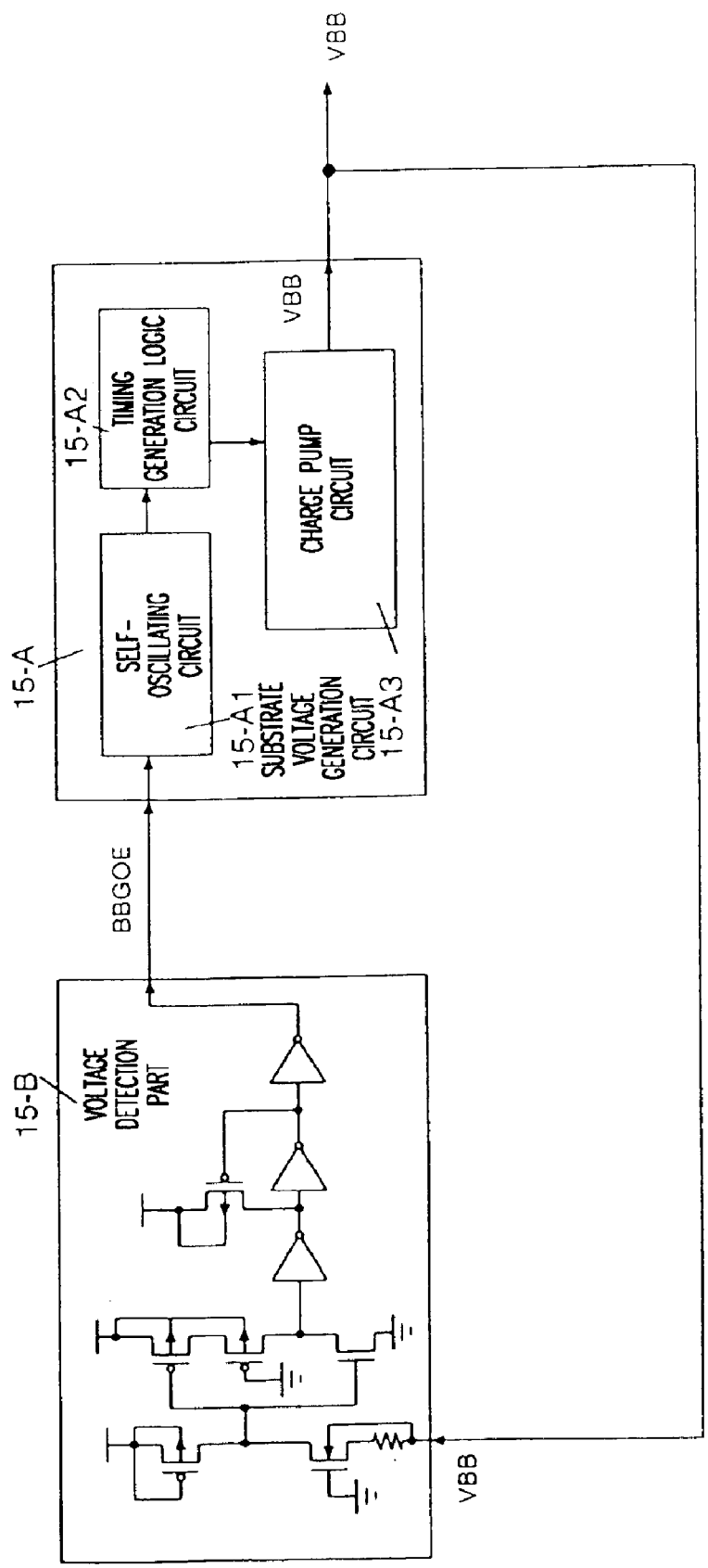
FIG. 14 is a block diagram showing a configuration of a conventional negative voltage generation circuit.
Figure 15:
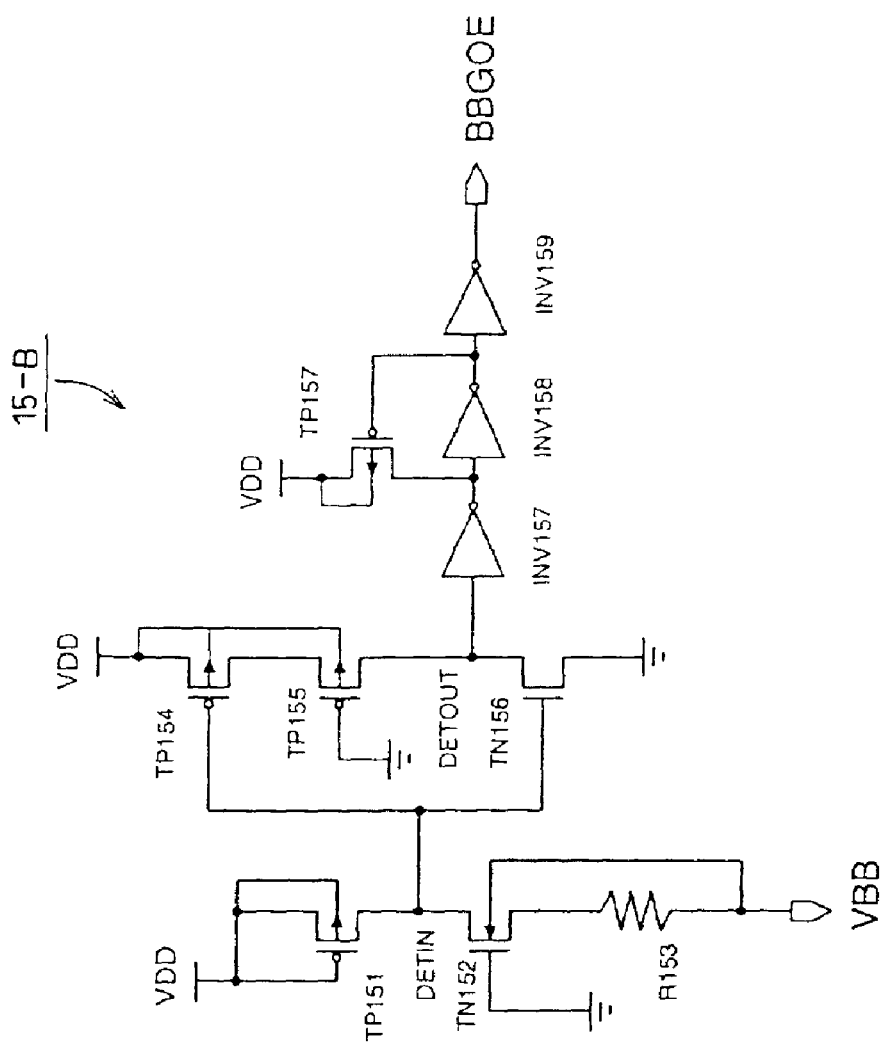
FIG. 15 is a detailed circuit diagram of a conventional voltage detection part 15-B.
Figures 16A, 16B:
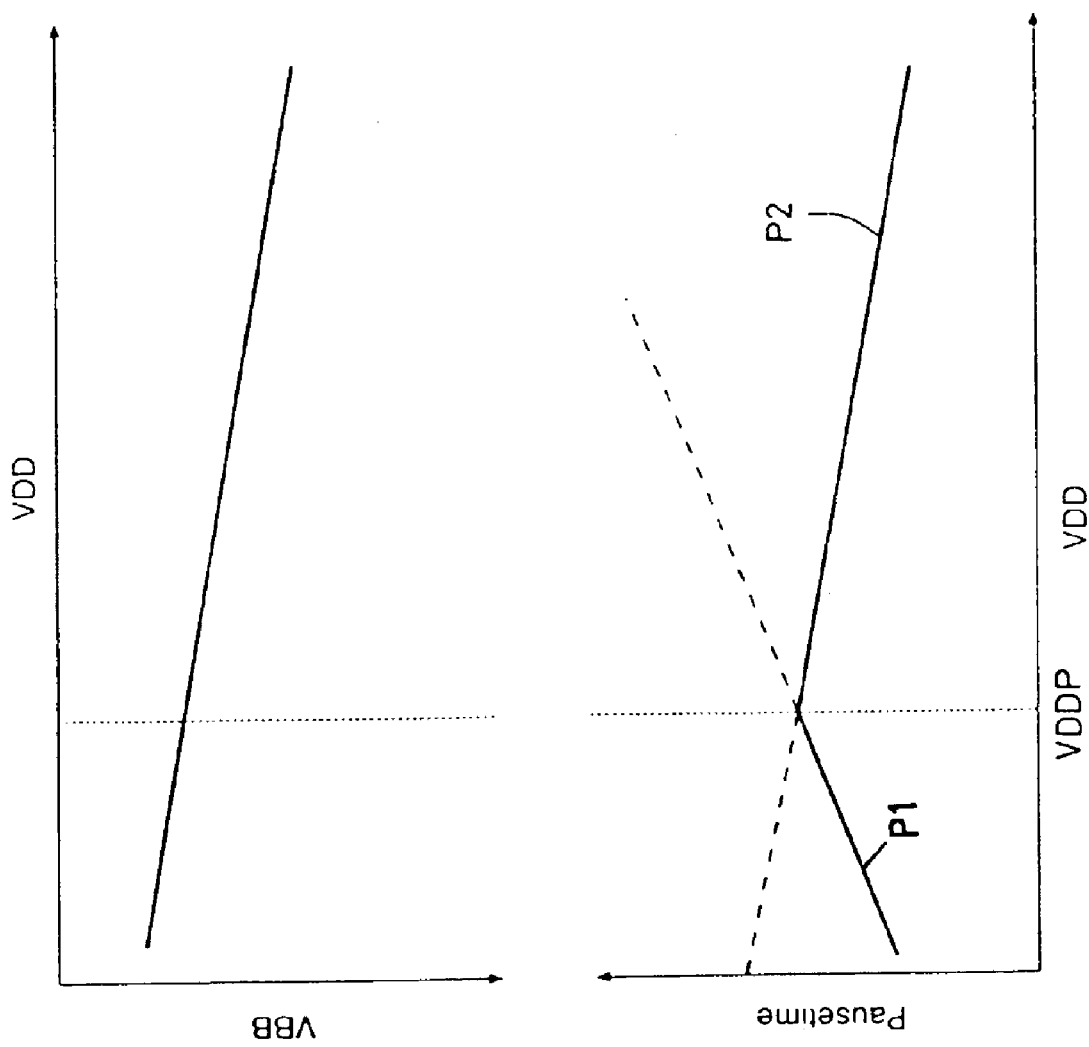
FIG. 16A is a graph showing the dependency of a negative voltage VBB on a power source voltage VDD in a conventional negative voltage generation circuit.
FIG. 16B is a graph showing the dependency of a pause time on the power source voltage VDD in a conventional memory.

FIG. 10 is a block diagram partially showing a configuration example of a negative voltage generation circuit included in a semiconductor integrated circuit according to a third embodiment of the present invention.

As shown in FIG. 10, the present embodiment includes, in addition to a first voltage detection part for generating a control signal BBGOE from a constant voltage STDVOUT1 replicated by a first voltage supplying circuit 1-B2 including a differential amplifier AMP11 and a P-channel transistor TP11 and from a negative voltage VBB, a third voltage detection part capable of generating a control signal CTRLOUT from a constant voltage STDVOUT3 replicated by a third voltage supplying circuit 1-B2" including a differential amplifier AMP11C and a P-channel transistor TP11C, and from a voltage VMEASURE supplied to a non-inverting input terminal of a differential amplifier AMP312.

Here, when the voltage VMEASURE=(R6/(R5+R6))·STDVOUT3 is applied, a control by the control signal CTRLOUT is possible. As one example, the third voltage detection part can be operated as a circuit for detecting a stepped-up power source voltage VPP by the control signal CTRLOUT.

In this way, without directly using the output V9 from the constant voltage generation circuit, and by replicating the voltage and using it, the plurality of voltage detection parts can be operated independently.

As a test item of a negative voltage generation circuit according to the embodiment of the present invention, an output voltage needs to be regulated by fuses in order to suppress an output fluctuation of the constant voltage generation circuit due to the conditions for the element manufacturing process or the like. Therefore, for test of semiconductor integrated circuits manufactured on the same wafer, instead of inspecting the total number thereof, to inspect the negative voltage generation circuit after it is judged in advance whether the circuits are defective is useful to shorten the test time.

In the DRAM, a circuit block to which this negative voltage generation circuit is applied is a memory cell, and the judgement whether its characteristics are defective is made based on a pause time measurement of the memory cell.

Therefore, one example of an algorithm of the test program, in which the above-mentioned aspect is taken into consideration, can be shown as the following procedure:

(1) A negative voltage is input from an input terminal that is independent of a negative voltage generation circuit into a substrate area of a memory cell, and the measurement of a pause time for each DRAM provided in a semiconductor integrated circuit on a wafer is performed. Furthermore, at the same time, the value of a substrate voltage in which the pause time reaches its maximum is recorded for each circuit.

(2) Among the circuits whose results of the pause time measurement satisfy the specifications, non-defective circuits are selected, and only for those circuits judged as non-defective is the test of a negative voltage generation circuit performed.

(3) In the case where the output voltage from the negative voltage generation circuit is different from the value of the substrate voltage obtained by the pause time test performed in advance by an external voltage input, fuses provided in the circuit are used to regulate the output voltage so that a value that is equal to the substrate voltage is output.

(4) Hereinafter, a function test of the DRAM is performed only for those circuits whose pause time satisfies the specifications and whose voltage of the negative voltage generation circuit is already regulated.

In this way, a test method is provided in which the test of a negative voltage generation circuit is performed only for those circuits judged as non-defective to shorten the test time, and at the same time, since the negative voltage output can be regulated to achieve the maximum pause time for each circuit, the setting according to the test method can make the most use of the memory performance.

As explained above, according to the present invention, it is possible to realize easily a negative voltage generation circuit capable of supplying a memory cell transistor substrate with a stable negative voltage, independently of the fluctuation of a power source voltage or environmental conditions and the process conditions etc., and while securing the data holding time of a memory sufficiently by maintaining the conditions under which leakage currents of a memory cell transistor become minimum, the power consumption is reduced, so that it is particularly effective for application to a portable recording device, communication device or the like.

Figure 17:
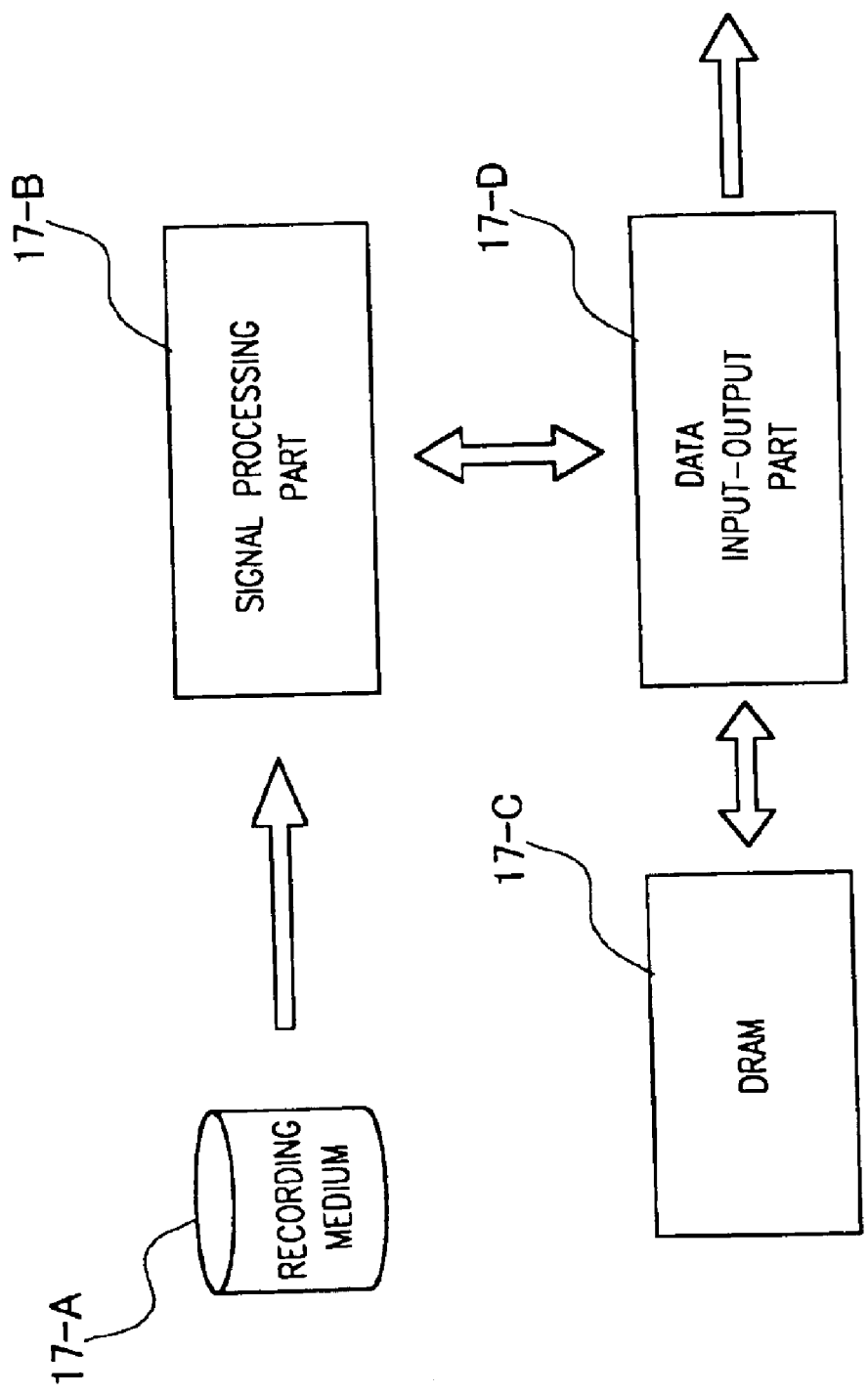
FIG. 17 is a schematic block diagram showing an example of a recording device system to which the present invention is applied.
Figure 18:
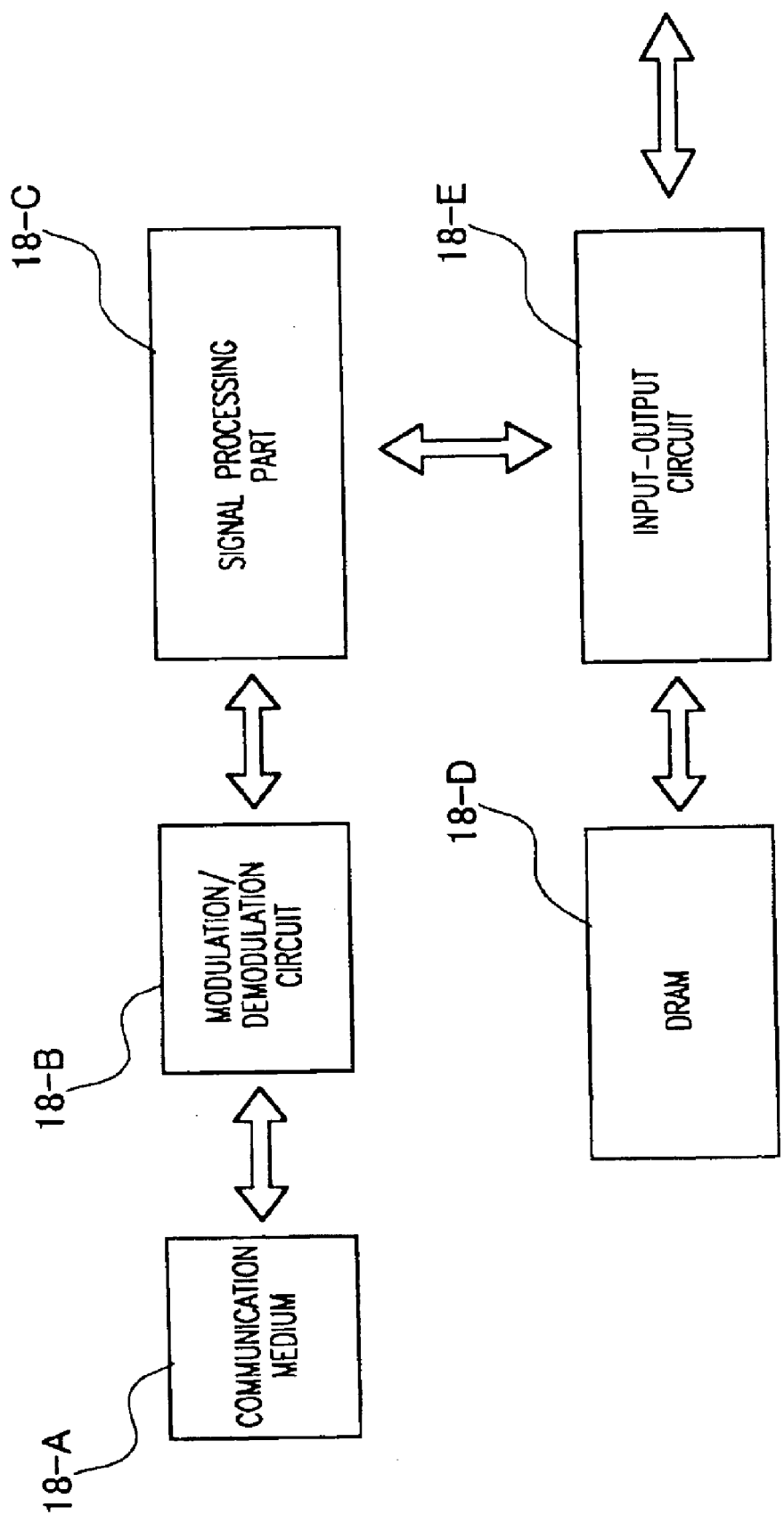
FIG. 18 is a schematic block diagram showing an example of a communication equipment system to which the present invention is applied.

FIG. 17 and FIG. 18 are schematic block diagrams respectively showing a recording device system and a communication equipment system to which the present invention is applied.

In FIG. 17, the recording device system performs the operation of readout or write optically or magnetically, or by combing the both ways. The readout operation will be explained by referring to FIG. 17. The recording device system includes a recording medium 17-A, a signal processing part 17-B, a dynamic random access memory according to the present invention 17-C, and a data input-output part 17-D.

Here, the signal processing part 17-B reads out information by obtaining information from the recording medium 17-A as signals and by performing an analog-digital signal processing contained inside. The readout signals may have insufficient signal strength due to a change in temperature conditions etc., so that they are compared with the expected values by error correction codes, and thus, correct data will be output from the data input-output part 17-D.

Therefore, the recording device is required to have information necessary for performing an error correction in addition to the data to be read out actually from the recording medium 17-A, and therefore, the dynamic random access memory 17-C is necessary for the temporary storage of the data for correction.

Furthermore, for improving the access speed of the readout operation and also for the temporary storage of the readout data and the data that went through the error correction processing, the dynamic random access memory 17-C is used.

In FIG. 18. the communication system includes circuit elements consisting of a communication medium 18-A, a modulation/demodulation circuit 18-B, a signal processing circuit 18-C, a dynamic random access memory according to the present invention 18-D, and an input-output circuit 18-E. With regard to the communication medium 18-A, a connection with remote communication equipment is established either by cable or by radio waves, and due to a decrease in signal strength, a lack of information may arise in the modulation/demodulation circuit 18-B. The signal processing circuit 18-C has the function of converting analog signals that are output from the modulation/demodulation circuit 18-B into digital signals, so that the output data obtained from the input-output circuit 18-E are digital data.

Also for this communication equipment system, the dynamic random access memory 18-D is used for the purpose of supplementing the lacking information or to increase the information speed.

According to the present invention, by improving the data holding characteristics of the dynamic random access memories 17-C and 18-D, the data processing capability of the recording device or the communication equipment is enhanced. At the same time, since the refresh operation cycle of the dynamic random access memory can be elongated, according to the present invention, the improvement of the data holding characteristics of the dynamic random access memory has the effect of reducing the power consumption of the system.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising a functional block and a negative voltage generation circuit for generating a predetermined negative voltage to be supplied to the functional block, the negative voltage generation circuit having a charge pump part, which converts a power source voltage into the predetermined negative voltage and outputs it, and a voltage detection part, which controls the output voltage of the charge pump part by comparing the output voltage of the charge pump part with a reference voltage and outputting the result of comparison to the charge pump part, wherein ground voltage is used as the reference voltage, and the charge pump part comprises a self-oscillating circuit, which generates a predetermined pulse signal only during a period in which an output signal from the voltage detection part is in an activated state, and a timing signal generation circuit, which converts the
output pulse signal from the self-oscillating circuit into
a timing signal,
and wherein the voltage detection part comprises
a constant voltage generation circuit,
a measuring voltage generation circuit, which receives an
output voltage from the constant voltage generation
circuit and an output voltage from the charge pump part
and generates a divided measuring voltage by resistive
means,
a first comparator for outputting the result of comparison
after comparing the measuring voltage from the measuring voltage generation circuit with the ground
voltage, and
an output buffer circuit for amplifying the compared result
from the first comparator and outputting it to the charge
pump part.

2. A semiconductor integrated circuit comprising a functional block and a negative voltage generation circuit for generating a predetermined negative voltage to be supplied to the functional block,
the negative voltage generation circuit having
a charge pump part, which converts a power source voltage into the predetermined negative voltage and outputs it, and
a voltage detection part, which controls the output voltage of the charge pump part by comparing the output voltage of the charge pump part with a reference voltage and outputting the result of comparison to the charge pump part,
wherein the voltage detection part comprises
a constant voltage generation circuit,
a measuring voltage generation circuit, which receives an output voltage from the charge pump part and generates a measuring voltage based on the output voltage from the charge pump part, and
a first comparator, coupled to receive a ground voltage as a reference voltage, for comparing the measuring voltage with the ground voltage.

3. The semiconductor integrated circuit according to claim 1, wherein the voltage detection part comprises transistors and among the transistors included in the voltage detection part, all the voltage applied to substrates of N-channel transistors are set as ground voltage.

4. The semiconductor integrated circuit according to claim 1, wherein the voltage detection part has a voltage supplying circuit including a second comparator and a P-channel transistor interposed between the constant voltage generation circuit and the measuring voltage generation circuit,
wherein the voltage supplying circuit outputs a voltage based on the output voltage of the constant voltage generation circuit according to a configuration in which an output from the constant voltage generation circuit is supplied to an inverting input terminal of the second comparator, a power source voltage is supplied to a drain terminal of the P-channel transistor, an output from the second comparator is supplied to a gate terminal of the P-channel transistor, a source terminal of the P-channel transistor is coupled to a non-inverting input terminal of the second comparator, and an output from the source terminal of the P-channel transistor is coupled to the measuring voltage generation circuit.

5. The semiconductor integrated circuit according to claim 4, wherein the functional block comprises a memory block.

6. The semiconductor integrated circuit according to claim 1, wherein the first comparator has a first differential amplifier, a second differential amplifier and a third differential amplifier,
wherein the measuring voltage is supplied to one input terminal of the first differential amplifier while ground voltage is supplied to the other input terminal,
ground voltage is supplied to one input terminal of the second differential amplifier while the measuring voltage is supplied to the other input terminal,
an output voltage of the first differential amplifier is supplied to one input terminal of the third differential amplifier while an output voltage of the second differential amplifier is supplied to the other input terminal,
and the output voltages from the first and the second differential amplifiers have reversed phases.

7. The semiconductor integrated circuit according to claim 1, wherein the constant voltage generation circuit has first voltage regulation means for regulating an output voltage by changing an output current value through a change in the size of transistors included in a current mirror circuit, and the measuring voltage generation circuit has second voltage regulation means for changing a measuring voltage by changing the resistance of the resistive means.

8. The semiconductor integrated circuit according to claim 7, wherein the resistive means include a first resistor to a nth resistor serially-connected to each other, and the second voltage regulation means includes a first fuse to a nth fuse parallel-connected to each of the first resistor to the nth resistor,
wherein, when the resistance of the first resistor parallel-connected to the first fuse is defined as R, the resistance of the nth resistor parallel-connected to the nth fuse is set as $2^{(n-1)}$ times R, and the second voltage regulation means changes the measuring voltage by disconnecting at least one of the first to nth fuses and changing increments of the resistance from R to $2^{(n-1)}$ times R.

9. The semiconductor integrated circuit according to claim 1, wherein the first comparator of the voltage detection part includes transistors having a thicker gate oxide film than that of transistors used for a circuit in a stage preceding the first comparator in the voltage detection part.

10. The semiconductor integrated circuit according to claim 1, wherein the output buffer circuit of the voltage detection part has inverters in a plurality of stages where an inverter in a first stage includes transistors having a thicker gate oxide film than that of each inverter in other stages.

11. A method for inspecting a semiconductor integrated circuit, the semiconductor integrated circuit comprising a functional block and a negative voltage generation circuit for generating a predetermined negative voltage to be supplied to the functional block, the negative voltage generation circuit having a charge pump part, which converts a power source voltage into the predetermined negative voltage and outputs it, and a voltage detection part, which controls the output voltage of the charge pump part by comparing the output voltage of the charge pump part with a reference voltage and outputting the result of comparison to the charge pump part,
wherein the voltage detection part comprises a measuring voltage generation circuit, which receives an output from the charge pump part and generates a measuring voltage based on the output voltage from the charge pump part, and a comparator coupled to receive a ground voltage as a reference voltage, for comparing the measuring voltage with the ground voltage, the test method comprising performing a test by externally applying a predetermined voltage to the functional block, judging whether the functional block is defective based on the results of the test, and supplying a predetermined negative voltage from the negative voltage generation circuit only for the functional block judged as non-defective.

12. A method for inspecting a semiconductor integrated circuit, the semiconductor integrated circuit comprising a functional block and a negative voltage generation circuit for generating a predetermined negative voltage to be supplied to the functional block, the negative voltage generation circuit having a charge pump part, which converts a power source voltage into the predetermined negative voltage and outputs it, and a voltage detection part, which controls the output voltage of the charge pump part by comparing the output voltage of the charge pump part with a reference voltage and outputting the result of comparison to the charge pump part, wherein the voltage detection part comprises a measuring voltage generation circuit, which receives an output from the charge pump part and generates a measuring voltage based on the output voltage from the charge pump part, and a comparator coupled to receive a ground voltage as a reference voltage, for comparing the measuring voltage with the ground voltage, the test method comprising performing a test by externally applying a predetermined voltage to be output by the negative voltage generation circuit to the functional block, judging whether the functional block is defective based on the results of the test and recording voltage conditions optimizing operating conditions of the functional block, connecting the negative voltage generation circuit whose output voltage is regulated to the voltage conditions only to the functional block judged as non-defective, and performing test items of the functional block by supplying a negative voltage.

13. A circuit for use in a recording device comprising a semiconductor integrated circuit, the semiconductor integrated circuit comprising a functional block and a negative voltage generation circuit for generating a predetermined negative voltage to be supplied to the functional block, the negative voltage generation circuit having a charge pump part, which converts a power source voltage into the predetermined negative voltage and outputs it, and a voltage detection part, the voltage detection part comprising a constant voltage generation circuit, a measuring voltage generation circuit, which receives an output voltage from the charge pump part and generates a measuring voltage based on the output voltage from the charge pump part, and a comparator, coupled to receive a ground voltage as a reference voltage, for comparing the measuring voltage with the ground voltage, wherein the recording device comprises a recording system using at least one selected from light and magnetism.

14. A circuit for use in communication equipment comprising a semiconductor integrated circuit, the semiconductor integrated circuit comprising a functional block and a negative voltage generation circuit for generating a predetermined negative voltage to be supplied to the functional block, the negative voltage generation circuit having a charge pump part, which converts a power source voltage into the predetermined negative voltage and outputs it, and a voltage detection part, wherein the voltage detection part comprises a constant voltage generation circuit, a measuring voltage generation circuit, which receives an output voltage from the charge pump part and generates a measuring voltage based on the output voltage from the charge pump part, and a comparator, coupled to receive a ground voltage as a reference voltage, for comparing the measuring voltage with the ground voltage.

15. A method for inspecting a semiconductor integrated circuit, the semiconductor integrated circuit comprising a memory block and a negative voltage generation circuit for generating a predetermined negative voltage to be supplied to the memory block, the negative voltage generation circuit having a charge pump part, which converts a power source voltage into the predetermined negative voltage and outputs it, and a voltage detection part, wherein the voltage detection part comprises a measuring voltage generation circuit, which receives an output from the charge pump part and generates a measuring voltage based on the output voltage from the charge pump part, and a comparator coupled to receive a ground voltage as a reference voltage, for comparing the measuring voltage with the ground voltage, the test method comprising performing a test by externally applying a predetermined voltage to the memory block, judging whether the memory block is defective based on the results of the test, and supplying a predetermined negative voltage from the negative voltage generation circuit only for the memory block judged as non-defective.

16. A method for inspecting a semiconductor integrated circuit, the semiconductor integrated circuit comprising a memory block and a negative voltage generation circuit for generating a predetermined negative voltage to be supplied to the memory block, the negative voltage generation circuit having a charge pump part, which converts a power source voltage into the predetermined negative voltage and outputs it, and a voltage detection part, wherein the voltage detection part comprises a measuring voltage generation circuit, which receives an output from the charge pump part and generates a measuring voltage based on the output voltage from the charge pump part, and a comparator coupled to receive a ground voltage as a reference voltage, for comparing the measuring voltage with the ground voltage, the test method comprising performing a test by externally applying a predetermined voltage to be output by the negative voltage generation circuit to the memory block, judging whether the memory block is defective based on the results of the test and recording voltage conditions optimizing operating conditions of the memory block, connecting the negative voltage generation circuit whose output voltage is regulated to the voltage conditions only to the memory block judged as non-defective, and performing test items of the memory block by supplying a negative voltage.

17. A circuit for use in a recording device comprising a semiconductor integrated circuit, the semiconductor integrated circuit comprising a memory block and a negative voltage generation circuit for generating a predetermined negative voltage to be supplied to the memory block, the negative voltage generation circuit having a charge pump part, which converts a power source voltage into the predetermined negative voltage and outputs it, and a voltage detection part, the voltage detection part comprising a constant voltage generation circuit, a measuring voltage generation circuit, which receives an output voltage from the charge pump part and generates a measuring voltage based on the output voltage from the charge pump part, and a comparator coupled to receive a ground voltage as a reference voltage, for comparing the measuring voltage with the ground voltage, wherein the recording device comprises a recording system using at least one selected from light and magnetism.

18. A circuit for use in communication equipment comprising a semiconductor integrated circuit, the semiconductor integrated circuit comprising a memory block and a negative voltage generation circuit for generating a predetermined negative voltage to be supplied to the memory block, the negative voltage generation circuit having a charge pump part, which converts a power source voltage into the predetermined negative voltage and outputs it, and a voltage detection part, the voltage detection part comprising a constant voltage generation circuit, a measuring voltage generation circuit, which receives an output voltage from the charge pump part and generates a measuring voltage based on the output voltage from the charge pump part, and a comparator coupled to receive a ground voltage as a reference voltage, for comparing the measuring voltage with the ground voltage.

* * * * *